(12) United States Patent
Nishimura et al.

(10) Patent No.: US 9,293,564 B2
(45) Date of Patent: Mar. 22, 2016

(54) SEMICONDUCTOR DEVICE MANUFACTURING METHOD

(71) Applicant: FUJI ELECTRIC CO., LTD., Kawasaki-shi (JP)

(72) Inventors: Takeyoshi Nishimura, Matsumoto (JP); Shun Yamaguchi, Matsumoto (JP); Toshiaki Sakata, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/710,536

(22) Filed: May 12, 2015

(65) Prior Publication Data

US 2015/0364577 A1    Dec. 17, 2015

(30) Foreign Application Priority Data

Jun. 16, 2014  (JP) .................................. 2014-123866
Dec. 24, 2014  (JP) .................................. 2014-260024

(51) Int. Cl.
| H01L 21/336 | (2006.01) |
|---|---|
| H01L 29/66 | (2006.01) |
| H01L 29/06 | (2006.01) |
| H01L 29/10 | (2006.01) |
| H01L 21/324 | (2006.01) |
| H01L 21/225 | (2006.01) |
| H01L 21/265 | (2006.01) |

(52) U.S. Cl.
CPC ...... *H01L 29/66712* (2013.01); *H01L 21/2251* (2013.01); *H01L 21/26513* (2013.01); *H01L 21/324* (2013.01); *H01L 29/0634* (2013.01); *H01L 29/0696* (2013.01); *H01L 29/1095* (2013.01)

(58) Field of Classification Search
USPC .......................................... 438/268; 257/342
See application file for complete search history.

(56) References Cited

U.S. PATENT DOCUMENTS

| 2005/0145933 A1* | 7/2005 | Onishi ................ H01L 29/0634 257/328 |
|---|---|---|
| 2009/0101974 A1* | 4/2009 | Saito .................... H01L 29/0615 257/342 |
| 2009/0111230 A1 | 4/2009 | Nishimura |

FOREIGN PATENT DOCUMENTS

| JP | 2009-016618 A | 1/2009 |
|---|---|---|
| JP | 2009-105110 A | 5/2009 |
| JP | 2009-105268 A | 5/2009 |
| JP | 2013-102087 A | 5/2013 |

* cited by examiner

*Primary Examiner* — Tuan Nguyen
(74) *Attorney, Agent, or Firm* — Rabin & Berdo, P.C.

(57) ABSTRACT

A method of manufacturing a semiconductor device includes forming a first parallel pn layer; depositing a first-conductivity-type first semiconductor layer on a surface of the first parallel pn layer in a step that further includes forming a second parallel pn layer by selectively introducing second-conductivity-type impurities into the first semiconductor layer; and forming first second-conductivity-type impurity regions in positions opposed in a depth direction to regions of the first parallel pn layer in which second-conductivity-type semiconductor regions are formed; and forming a local insulating film on a surface of the first semiconductor layer in a termination structure portion so that an end portion of the local insulating film is positioned on the first second-conductivity-type impurity region, by heating at a low temperature effective to suppress diffusion of the first second-conductivity-type impurity regions. The method may further include diffusing the first second conductivity type impurity regions in a second heat treatment.

24 Claims, 29 Drawing Sheets

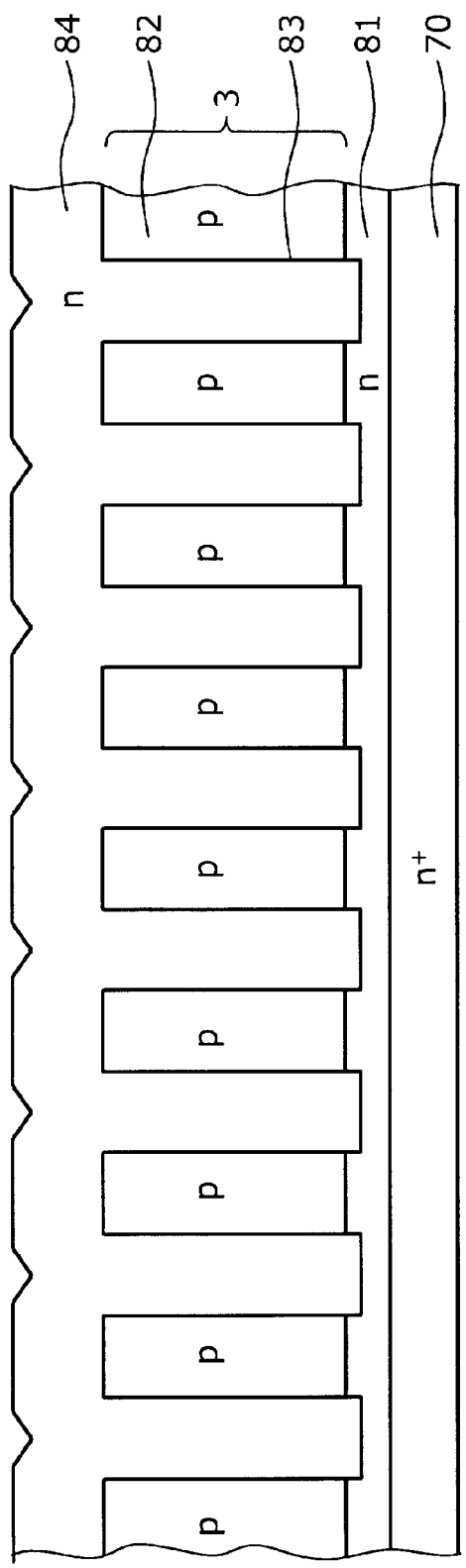

SEMICONDUCTOR DEVICE MANUFACTURING METHOD

CROSS-REFERENCE TO RELATED APPLICATION(S)

This non-provisional Application claims the benefit of the priority of Applicant's earlier filed Japanese Patent Application Laid-open Nos. 2014-123866 filed Jun. 8, 2014, and 2014-260024 filed Dec. 24, 2014, the entire contents of which are incorporated herein by reference.

BACKGROUND OF THE INVENTION

1. Field of the Invention

The present invention relates to a semiconductor device manufacturing method.

2. Description of the Related Art

Recently, an increase in demand for an environmentally friendly automobile and a consumer electrical appliance lead to a growing demand for power saving of a power switching device. In a breakdown voltage class of 1000V or less, a most mainstream switching device is a power MOSFET (Metal Oxide Semiconductor Field Effect Transistor: an insulated gate field effect transistor) suitable for fast switching. The device structure (element structure) of a power MOSFET is divided broadly into a vertical type and a horizontal type, and a vertical type power MOSFET has characteristics superior to a horizontal type power MOSFET in terms of a large current and low on-resistance.

In order to achieve power saving in the vertical type power MOSFET, researches on a reduction in on-resistance exceeding the physical property limit of a silicon (Si) semiconductor have been promoted. As a MOSFET responding to the demand for power saving, a semiconductor device having a charge compensation device structure which compensates for the charge amount in a drift layer, which is a current path, is known. As a typical device structure of the charge compensation type, a super junction (SJ) structure with a drift layer as a parallel pn layer wherein n-type regions and p-type regions are alternately disposed in a direction parallel to a main surface of a substrate (hereafter referred so as a lateral direction) is known.

In a heretofore known MOSFET with a drift layer configured of only single conductivity type regions, when applying a voltage between the source and the drain, a depletion layer extends from a pn junction between a base region and the drift layer in a direction perpendicular to the main surface of the substrate (a substrate depth direction (hereafter referred to as a vertical direction)). Therefore, the electric field strength in the drift layer decreases toward the rear surface of the substrate. Meanwhile, in a MOSFET of a super junction structure (hereafter referred to as a super junction MOSFET), when applying a voltage between the source and the drain, a depletion layer extends in the lateral direction from the pn junctions between the n-type regions and p-type regions of the parallel pn layer configuring the drift layer. Therefore, in an ideal super junction MOSFET, the electric field strength in the drift layer is uniform regardless of a depth position.

Consequently, in the super junction MOSFET, when the impurity concentration distribution of the drift layer is set to the same level as in the heretofore known MOSFT, breakdown voltage characteristics calculated with the value of an integral of the electric field strength are superior to those of the heretofore known MOSFET even though the maximum electric field strength and on-resistance are at the same level as in the heretofore known MOSFET. The application of a super junction semiconductor device having these kinds of characteristics is spreading even to the field using a power device of a low breakdown voltage class. However, the need for a miniaturization (a reduction in the repetitive pitch of the n-type regions and p-type regions of the parallel pn layer), as well as for an increase in the impurity concentration of the n-type regions and p-type regions of the parallel pn layer, in order to reconcile both a low on-resistance and a reduction in turn-on characteristics, poses an impediment to the application of the super junction structure to a low breakdown voltage power device.

Also, in the power device, the maintenance of the breakdown voltage of a termination structure portion poses a challengem. Therefore, structural measures to increase the breakdown voltage are also necessary for the super junction semiconductor device. As a super junction semiconductor device with the increased breakdown voltage, a device wherein the parallel pn layer configuring the drift layer is disposed from an active region over to the termination structure portion is proposed. It is a useful method to reduce the repetitive pitch of the n-type regions and p-type regions of the parallel pn layer in the termination structure portion. Also, from the viewpoint of securing the breakdown voltage, it is preferable, in order to expand the range in which a depletion layer extends, that the n-type regions and p-type regions of the parallel pn layer are disposed so that the parallel pn layer extends to a surface of a semiconductor portion (the interface between the front surface of the substrate and an interlayer insulating film) in the termination structure portion.

It is possible to form the upper end portions (the surface side portions of the semiconductor portion) of the p-type regions of the parallel pn layer, at the same time as a p-type RESURF region, by ion implantation for forming a p-type region (hereafter referred to as a p-type RESURF region) configuring a known RESURF (REduced SURface Field) structure. That is, when forming an ion implantation mask for forming the p-type RESURF region, portions of the ion implantation mask above the p-type regions of the parallel pn layer are also opened, and p-type impurity ion implantation is carried out using the ion implantation mask. Specifically, the parallel pn layer is formed in the following way.

FIG. 24 is a sectional view showing a condition of a heretofore known super junction semiconductor device in the process of being manufactured. As shown in FIG. 24, firstly, an n-type epitaxial layer 102 is deposited on the front surface of an $n^+$-type semiconductor substrate 101 by an epitaxial growth method. Next, n-type impurity regions 121 forming n-type regions of a parallel pn layer is formed in the surface layer of the n-type epitaxial layer 102 by photolithography and n-type impurity ion implantation (the dot-shaded portions). Next, p-type impurity regions 122 forming p-type regions of the parallel pn layer are formed in the surface layer of the n-type epitaxial layer 102 by photolithography and p-type impurity ion implantation (the diagonally hatched portions). That is, the n-type impurity regions 121 and the p-type impurity regions 122 are alternately formed in the n-type epitaxial layer 102.

Next, an n-type epitaxial layer (hereafter referred to as an upper n-type epitaxial layer 102) is further deposited on the n-type epitaxial layer 102 (hereafter referred to as the lower n-type epitaxial layer 102) by an epitaxial growth method. Next, n-type impurity regions 121 and p-type impurity regions 122 are formed in the surface layer of the newly deposited upper n-type epitaxial layer 102 so as to be opposed in the vertical direction to the respective n-type impurity regions 121 and p-type impurity regions 122 of the lower n-type epitaxial layer 102. The deposition of the epitaxial layers 102 and the formation of the n-type impurity regions 121 and p-type impurity regions 122 are repeatedly carried out in this way, thus increasing the thickness of the n-type epitaxial layer 102.

Next, an uppermost n-type epitaxial layer 102 is further deposited on the n-type epitaxial layer 102. Next, a resist mask 131 acting as an ion implantation mask for forming the p-type RESURF region (not shown) is formed on the uppermost n-type epitaxial layer 102 by photolithography and etching. Opening portions are formed in portions of the resist mask 131 corresponding to regions in which to form the p-type RESURF region and in portions thereof above the p-type impurity regions 122 of the lower layer. Next, p-type impurity ion implantation 132 is carried out with the resist mask 131 as a mask, thus forming the p-type RESURF region and p-type impurity regions 122 (the p-type impurity regions 122 are not shown) in the surface layer of the uppermost n-type epitaxial layer 102.

Portions on which no n-type impurity ion implantation for forming the n-type impurity regions 121 is carried out, and into which no p-type impurity is introduced (that is, portions covered by the resist mask 131), are left as the n-type regions in the uppermost n-type epitaxial layer 102. Subsequently, the vertically opposed n-type impurity regions 121, and the vertically opposed p-type impurity regions 122, of the individual n-type epitaxial layers 102 deposited on the n$^+$-type semiconductor substrate 101 are connected together, at the same time as the p-type RESURF region being diffused, by thermal diffusion treatment (drive-in) for diffusing the p-type RESURF region. By so doing, the parallel pn layer (not shown) is formed so as to extend to the surface of the semiconductor portion, thus completing the step of forming the parallel pn layer.

It is known that when a thick insulating film such as a LOCOS (Local Oxidation of Silicon: local insulating) film 106 is provided on the front surface of the substrate in the termination structure portion, an electric field concentrates on a portion below a level difference (a portion of the semiconductor portion in contact with an end portion 107 of the LOCOS film 106) formed on the surface of the semiconductor portion by a thickness-reduced end portion (the LOCOS bird's beak) 107 of the LOCOS film 106, thus causing a breakdown. Therefore, the measures to avoid the electric field concentration occurring immediately below (below the level difference of) the end portion 107 of the LOCOS film 106 are taken. The LOCOS bird's beak is a portion of the LOCOS film 106 formed with a silicon nitride film as a mask, which has grown so as to get under the mask, and is the beak of the bird shaped end portion 107, the thickness of which decreases toward the outside.

As a method of avoiding the electric field concentration occurring immediately below the end portion of the LOCOS film in the termination structure portion, a method whereby first and second concentration regions different in impurity concentration are formed immediately below the LOCOS film (in a portion of the semiconductor portion in contact with the LOCOS film) by carrying out p-type impurity ion implantation after forming a nitride film for forming the LOCOS film, and subsequently forming the LOCOS film, in a semiconductor device of a configuration wherein no parallel pn layer is provided in the termination structure portion, is proposed (for example, refer to JP-A-2009-016618 (paragraphs 0035 to 0041 and FIGS. 6 and 7)). In JP-A-2009-016618, the electric field concentration immediately below the end portion of the LOCOS film is relaxed by making the impurity concentration of the active region side first concentration region higher than that of the end portion of the LOCOS film and making the impurity concentration of the outside (chip end portion side) second concentration region higher than that of the first concentration region.

Also, as another method, a method whereby a RESURF region is formed, on the parallel pn layer of the termination structure portion, to a wide width so as to be disposed below a level difference, formed by a thickness-reduced end portion of a field insulating film, and so as to cover adjacent n-type regions and p-type regions of the parallel pn layer, is proposed (for example, refer to JP-A-2009-105110 (paragraph 0016)). In JP-A-2009-105110, as the RESURF region is formed to a wide width so as to cover a plurality of p-type regions of the parallel pn layer, it is possible to easily form the RESURF region immediately below the end portion of the field insulating film even when applied to the method of forming the parallel pn layer by repeatedly carrying out the deposition of the epitaxial layer and the ion implantation for forming the n-type regions and p-type regions forming the parallel pn layer in the deposited epitaxial layer, as heretofore described.

Also, as another method, the following method is proposed. Firstly, a p$^-$-type RESURF region is formed in the surface layer of an n$^-$-type semiconductor layer, and after a trench is formed, a gate insulating film is formed along the inner wall of the trench, and a thick oxide film is formed on the front surface of the substrate. Next, a gate electrode is formed in the trench via the gate insulating film, and gate polysilicon wiring is formed on the thick oxide film. Subsequently, p-type impurity ion implantation is carried out with the gate polysilicon wiring as a mask, and a p-type well region is formed on the active region side of the p$^-$-type RESURF region so as to overlap with the p$^-$-type RESURF region (for example, refer to JP-A-2009-105268 (paragraph 0014)). In JP-A-2009-105268, it is possible to form the p-type well region from immediately below the thick oxide film or immediately below the end portion of the thick oxide film over to the active region side.

Also, as another method, a method whereby after a plurality of trenches are formed in the n$^-$-type semiconductor layer in the termination structure portion, the parallel pn layer is formed by epitaxially growing a p-type buried layer in the trenches, on each occasion of which a relay diffusion region is formed in the surface layer of the p-type buried layer by p-type impurity ion implantation, and an insulating film is formed on the front surface of the substrate in the termination structure portion by a chemical vapor deposition (CVD) method so as to cover the relay diffusion region, is proposed (for example, refer to JP-A-2013-102087 (paragraphs 0038 to 0042 and FIGS. 2 and 3)). In JP-A-2013-102087, as the LOCOS oxidation accounting for a significant proportion of the heat history of the semiconductor portion in process of manufacture is not carried out, it is possible to avoid an occurrence of an excess impurity diffusion.

However, in JP-A-2009-105110 and JP-A-2009-105268, when the width of the opening portions of the ion implantation mask for forming the parallel pn layer is narrow, it is not possible to carry out p-type impurity ion implantation in a normal way. The reason is as follows. In the low breakdown voltage power device, as it is necessary to miniaturize the n-type regions and p-type regions of the parallel pn layer, as heretofore described, a microscopic opening pattern is formed in the ion implantation mask for forming the parallel pn layer. In this case, it is not possible to carry out the patterning of the ion implantation mask as designed depending on the height of a level difference formed on a surface of an element, or on the distance between the level difference and the mask opening portions. Therefore, when forming the p-type regions in the surface layer of the parallel pn layer and the p-type region immediately below the end portion of the insulating film using ion implantation and thermal diffusion treatment, it is not possible to accurately form the p-type regions in the vicinity of the level difference of the surface of the element.

For example, the carrier distribution of the parallel pn layer of the super junction semiconductor device fabricated (manufactured) in accordance with the heretofore known method heretofore described (refer to FIG. 24) is observed with a scanning capacitance microscopy (SCM). FIG. 25 is a sectional view schematically showing a condition in which a defect is caused in the process of manufacturing the heretofore known super junction semiconductor device. A design width w1 of the opening portions of the resist mask 131 for forming the p-type regions 112 in the uppermost n-type epitaxial layer 102, of the plurality of n-type epitaxial layers 102 deposited on the n$^+$-type semiconductor substrate 101, is set to 0.40 µm. After carrying out the p-type impurity ion implantation 132 for forming the p-type regions 112 using the resist mask 131, the n-type impurity regions 121 and p-type impurity regions 122 of the individual n-type epitaxial layers 102 stacked on the n$^+$-type semiconductor substrate 101 are diffused by thermal diffusion treatment.

As a result of this, it is confirmed, as shown in FIG. 25, that in the individual n-type epitaxial layers 102 other than the uppermost layer, the vertically opposed n-type impurity regions 121 connect together, and the vertically opposed p-type impurity regions 122 connect together, thus forming n-type regions 113 and p-type regions 111 of a parallel pn layer 103. It is confirmed that the p-type regions 112 are formed in portions of the uppermost n-type epitaxial layer 102 apart from the end portion 107 of the LOCOS film 106 so as to connect with the p-type regions 111 of the parallel pn layer 103. However, it is confirmed that the p-type regions 112 are not formed in a vicinity 133 of the end portion of the LOCOS film 106 in the uppermost n-type epitaxial layer 102, and that an n-type region 114b is left in a portion on the p-type regions 111 of the parallel pn layer 103 so as to connect regions 114a which are left in a portion on the n-type regions 113 of the parallel pn layer 103 by being covered with the resist mask 131.

That is, it is confirmed that a pattern defect of the resist mask 131 occurs, and the p-type impurity ion implantation 132 is not carried out in a normal way, in the vicinity 133 of the end portion of the LOCOS film 106. The reason is as follows. A level difference (an unevenness) formed by the LOCOS film 106 occurs on the surface of the semiconductor portion in the vicinity 133 of the end portion of the LOCOS film 106 by the time before forming the resist mask 131. When the resist mask 131 having microscopic opening portions is formed on the level difference of the surface of the semiconductor portion, the allowable limit of the patterning accuracy of the resist mask 131 is exceeded, thus inducing a pattern defect such as no formation of the opening portions of the resist mask 131. This reduces the accuracy of p-type impurity ion implantation. It is confirmed by the present inventors that the breakdown voltage of the termination structure portion is significantly reduced by the level difference of the surface of the semiconductor portion formed by the LOCOS film 106 being positioned on the n-type region 114b surface which increases in current density.

Also, when using a microscopically patterned ion implantation mask, it is difficult to form p-type regions in a predetermined shape and predetermined positions not only when forming the p-type regions 112 exposed to the surface of the semiconductor portion in order to extend the parallel pn layer 103 to the surface of the semiconductor portion, but also when forming an element structure including p-type regions formed so as to be exposed to the surface of the semiconductor portion. Therefore, there is a concern about an adverse effect on element characteristics due to a pattern defect of the ion implantation mask. In JP-A-2009-016618, as p-type impurity ion implantation is carried out on predetermined positions in a condition in which no level difference is formed on the surface of the semiconductor portion, the heretofore described problem raised by the level difference of the surface of the semiconductor portion is solved. However, when including a field plate-like structure as in a low breakdown voltage power device including a microscopic super junction structure, it is eventually difficult to form a predetermined element structure. The reason is as follows.

For example, when carrying out heat treatment, such as in the formation of the LOCOS film 106, after p-type impurity ion implantation, the diffusion of the p-type impurity regions 122 increases by a heat history such as that of the formation of the LOCOS film 106 being added. Therefore, there is a possibility that the p-type regions 111 (p-type impurity regions 122) connect together in the lateral direction and the n-type regions 113 (n-type impurity regions 121) of the parallel pn layer disappear. Particularly, when ion implanting no n-type impurity when forming the p-type regions 112 and n-type regions 114a in the uppermost n-type epitaxial layer 102 in order to extend the parallel pn layer 103 to the surface of the semiconductor portion, the p-type regions 112 are compensated with p-type impurities, while the n-type regions 114a are not compensated with n-type impurities. Therefore, there is a concern that the n-type regions 114a adjacent to the p-type regions 112 disappear due to a lateral diffusion of the p-type regions 112, and the p-type regions 112 connect together in the lateral direction, in the uppermost n-type epitaxial layer 102.

Also, not only in the n-type regions 114a and p-type regions 112 formed in the uppermost n-type epitaxial layer 102, but also in the n-type regions 113 and p-type regions 111 formed in the lower n-type epitaxial layer 102, an excess impurity diffusion accelerates the compensation of the n-type regions 113 with p-type impurities and the compensation of the p-type regions 111 with n-type impurities. Therefore, to carry out heat treatment, such as in the formation of the LOCOS film, after the n-type impurity and p-type impurity ion implantation for forming the parallel pn layer 103 causes a deterioration in on-resistance. In JP-A-2013-102087, as an insulating film is formed by the CVD method in place of the LOCOS film, it is possible to avoid the heat history experienced by the formation of the LOCOS film involving the semiconductor portion, but there is the problem that the insulating film formed by the CVD method is inferior in insulation properties and coating properties to the LOCOS film.

In order to solve the heretofore described challenges raised by the heretofore known technologies, the invention has for its object to provide a semiconductor device manufacturing method whereby it is possible to improve element characteristics and it is possible to accurately form a super junction structure.

SUMMARY OF THE INVENTION

In order to solve the problems and achieve the object of the invention, a semiconductor device manufacturing method according to the invention is a method of manufacturing a semiconductor device including, from an active region over to a termination structure portion, a first parallel pn layer in which first conductivity type semiconductor regions and second conductivity type semiconductor regions are alternately disposed and a second parallel pn layer disposed on the top of the first parallel pn layer, and the method has the following features. The active region is a region through which a current flows when in an on-state. The termination structure portion surrounds the active region and secures a predetermined breakdown voltage. Firstly, a first formation step which carries out a formation of the first parallel pn layer is carried out. Next, a second formation step which carries out a step of depositing a first conductivity type first semiconductor layer on a surface of the first parallel pn layer and a step of forming the second parallel pn layer by selectively introducing second conductivity type impurities into the first semiconductor layer and forming first second conductivity type impurity regions in positions opposed in a depth direction to regions of the first parallel pn layer in which to form the second conductivity type semiconductor regions is carried out. Next, a first heat treatment step which forms a local insulating film on a surface of the first semiconductor layer in the termination structure portion, so that an end portion of the local insulating film is positioned on the first second conductivity impurity region, by a first heat treatment at a low temperature which can suppress a diffusion of the first second conductivity type impurity regions is carried out. Next, a second heat treatment step which diffuses the first second conductivity type impurity regions using a second heat treatment.

Also, the semiconductor device manufacturing method according to the invention is such that in the aspect of the invention, the first formation step is such that a step of depositing a second semiconductor layer, and a step of selectively introducing first conductivity type impurities and second conductivity type impurities into the second semiconductor layer and alternately disposing first conductivity type impurity regions and second second conductivity type impurity regions in the surface layer of the second semiconductor layer, are repeatedly carried out until the total thickness of a plurality of the stacked second semiconductor layers reaches a predetermined thickness.

Also, the semiconductor device manufacturing method according to the invention is such that in the aspect of the invention, the first formation step is such that a step of depositing a first conductivity type second semiconductor layer, and a step of selectively introducing second conductivity type impurities into the second semiconductor layer and disposing a plurality of second second conductivity type impurity regions spaced from one another in a direction perpendicular to the depth direction on the surface layer of the second semiconductor layer, are repeatedly carried out until the total thickness of a plurality of the stacked second semiconductor layers reaches a predetermined thickness.

Also, the semiconductor device manufacturing method according to the invention is such that in the aspect of the invention, in the first heat treatment step, a condition in which the first conductivity type impurity regions opposed in the depth direction are spaced from one another and the second second conductivity type impurity regions opposed in the depth direction are spaced from one another is maintained.

Also, the semiconductor device manufacturing method according to the invention is such that in the aspect of the invention, in the first heat treatment step, the condition of the second second conductivity type impurity regions opposed in the depth direction being spaced from one another is maintained.

Also, the semiconductor device manufacturing method according to the invention is such that in the aspect of the invention, in the first formation step, the first conductivity type impurities and the second conductivity type impurities are selectively introduced into the second semiconductor layer by ion implantation. At this time, the dose amount and acceleration energy of the ion implantation are set so that the first conductivity type impurity regions and second second conductivity type impurity regions formed in the newly stacked second semiconductor layer are spaced from the respective first conductivity type impurity regions and second second conductivity type impurity regions opposed thereto in the depth direction.

Also, the semiconductor device manufacturing method according to the invention is such that in the aspect of the invention, in the first formation step, the second conductivity type impurities are selectively introduced into the second semiconductor layer by ion implantation, and the dose amount and acceleration energy of the ion implantation are set so that the second second conductivity type impurity regions formed in the newly stacked second semiconductor layer are spaced from the respective second second conductivity type impurity regions opposed thereto in the depth direction.

Also, the semiconductor device manufacturing method according to the invention is such that in the aspect of the invention, in the second heat treatment step, the first conductivity type semiconductor region wherein the first conductivity type impurity regions opposed in the depth direction are connected together, and the second conductivity type semiconductor region wherein the second second conductivity type impurity regions and first second conductivity type impurity region opposed in the depth direction are connected together, are formed.

Also, the semiconductor device manufacturing method according to the invention is such that in the aspect of the invention, in the second heat treatment step, the second conductivity type semiconductor region wherein the second second conductivity type impurity regions and first second conductivity type impurity region opposed in the depth direction are connected together, is formed.

Also, the semiconductor device manufacturing method according to the invention is such that in the aspect of the invention, in the first heat treatment step, the first heat treatment at a temperature of 1000° C. or less for 350 minutes or less is carried out.

Also, the semiconductor device manufacturing method according to the invention is such that in the aspect of the invention, an element structure formation step which forms an insulated gate structure formed of a metal oxide semiconductor in the first semiconductor layer in the active region after the first heat treatment step is carried out. The second heat treatment step is carried out at the same time as a diffusion step, of steps included in the element structure formation step, which diffuses a semiconductor region in which a channel is formed.

Also, the semiconductor device manufacturing method according to the invention is such that in the aspect of the invention, the second parallel pn layer is formed in the termination structure portion.

Also, the semiconductor device manufacturing method according to the invention is such that in the aspect of the invention, the repetitive pitch of the first conductivity type semiconductor regions with the second conductivity type semiconductor region therebetween is 3.0 μm or less.

Also, the semiconductor device manufacturing method according to the invention is such that in the aspect of the invention, the pitch of the adjacent second conductivity type semiconductor regions is 3.0 μm or less.

Also, the semiconductor device manufacturing method according to the invention is such that in the aspect of the invention, the first formation step includes a step of depositing a first conductivity type third semiconductor layer, a step of forming trenches of a predetermined depth in the third semiconductor layer, a step of embedding a second conductivity type fourth semiconductor layer in the trenches, and a step of flattening a surface of the fourth semiconductor layer and exposing a surface of the third semiconductor layer.

Also, the semiconductor device manufacturing method according to the invention is such that in the aspect of the invention, in the first heat treatment step, the first heat treatment is carried out at a temperature of 1000° C. or less for 350 minutes or less.

Also, the semiconductor device manufacturing method according to the invention is such that in the aspect of the invention, in the second heat treatment step, the second conductivity type semiconductor region wherein the first second conductivity type impurity region and fourth semiconductor layer opposed in the depth direction are connected together, is formed.

Also, the semiconductor device manufacturing method according to the invention is such that in the aspect of the invention, in the second formation step, the first second conductivity type impurity region is annularly formed.

According to the invention, as a local insulating film is formed after carrying out ion implantation for forming p-type regions of a second parallel pn layer in a first semiconductor layer deposited on a first parallel pn layer, no level difference formed by the local insulating film exists on a surface of a semiconductor portion when carrying out the ion implantation for forming each p-type region in an uppermost second semiconductor layer. Therefore, when fabricating, for example, a low breakdown voltage power device, it is possible to accurately form an ion implantation mask without causing a pattern defect even when a miniaturization of the parallel pn layers is achieved. Therefore, it is possible to accurately form the second parallel pn layer reaching the surface of the semiconductor portion in a termination structure portion, and it is thus possible to increase the breakdown voltage of the termination structure portion. Consequently, it is possible to make the breakdown voltage of the termination structure portion higher than the breakdown voltage of an active region. Also, according to the invention, as the local insulating film is formed by low temperature heat treatment, and the respective regions of the first and second parallel pn layers are collectively diffused when thermally diffusing a p-type base region (a semiconductor region in which a channel is formed), it is possible to suppress an excess impurity diffusion in the semiconductor portion heretofore caused by the formation of the local insulating film or the like. Therefore, as it is possible to prevent the first and second pn layers from disappearing, it is possible to obtain the low on-resistance effect produced by the first and second pn layers.

According to the semiconductor device manufacturing method of the invention, the advantageous effect that it is possible to improve element characteristics and it is possible to accurately form a super junction structure is produced.

BRIEF DESCRIPTION OF THE DRAWINGS

FIG. 19 is a sectional view showing a condition of the semiconductor device in the process of being manufactured according to a fifth embodiment;

DETAILED DESCRIPTION OF THE INVENTION

Hereafter, a detailed description will be given, referring to the accompanying drawings, of preferred embodiments of a semiconductor device manufacturing method according to the invention. In the present specification and the accompanying drawings, n or p in layers and regions prefixed with n or p means respectively that electrons or holes are majority carriers. Also, + and − suffixed to n or p respectively mean a higher impurity concentration and lower impurity concentration than in layers and regions affixed with neither + nor −. In the following description of the embodiments and the accompanying drawings, the same signs are given to like components, thus omitting a redundant description.

Embodiment 1

Figure 1A:
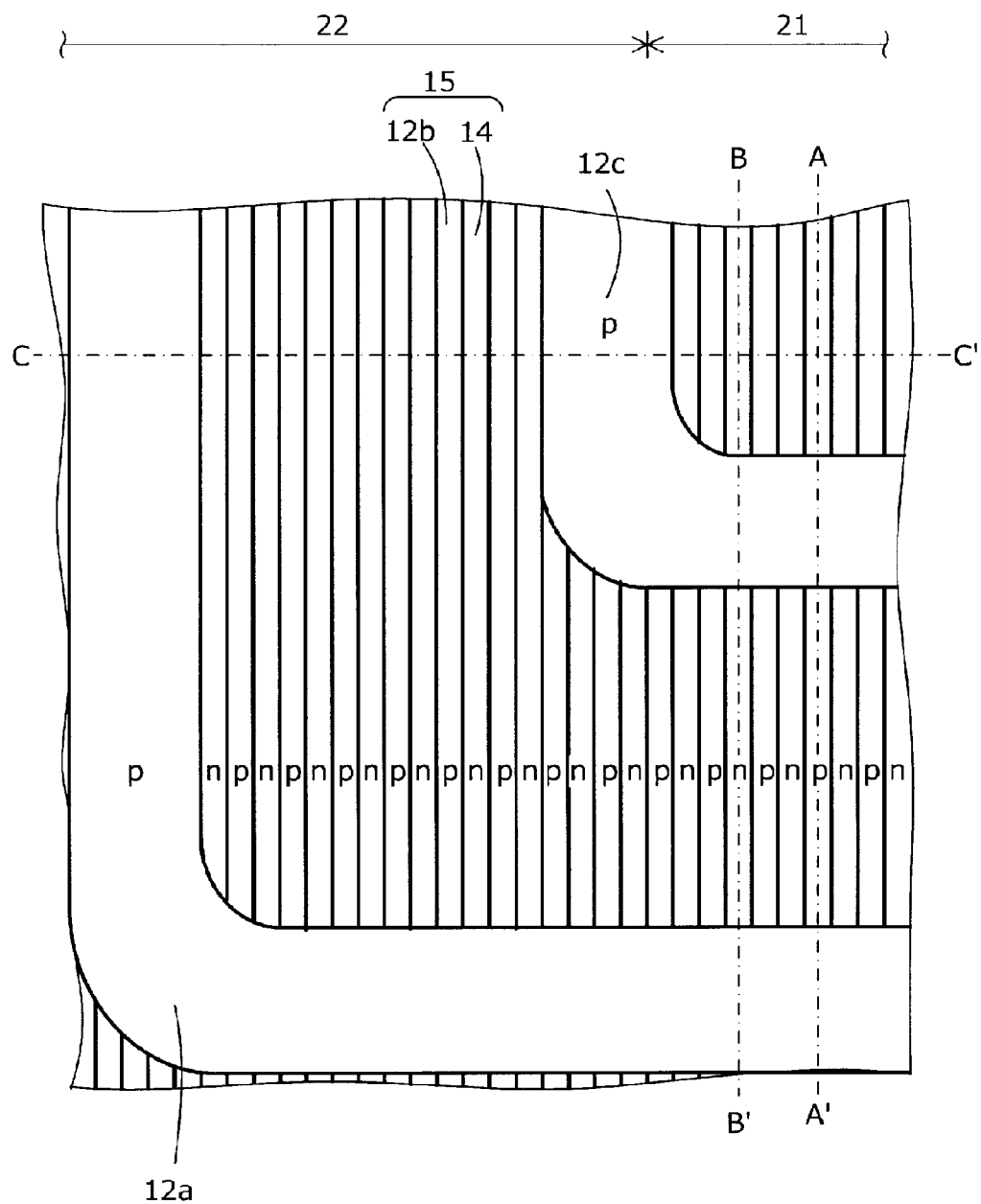
FIG. 1A is a plan view showing a planar structure of a semiconductor device according to a first embodiment.
Figure 1B:
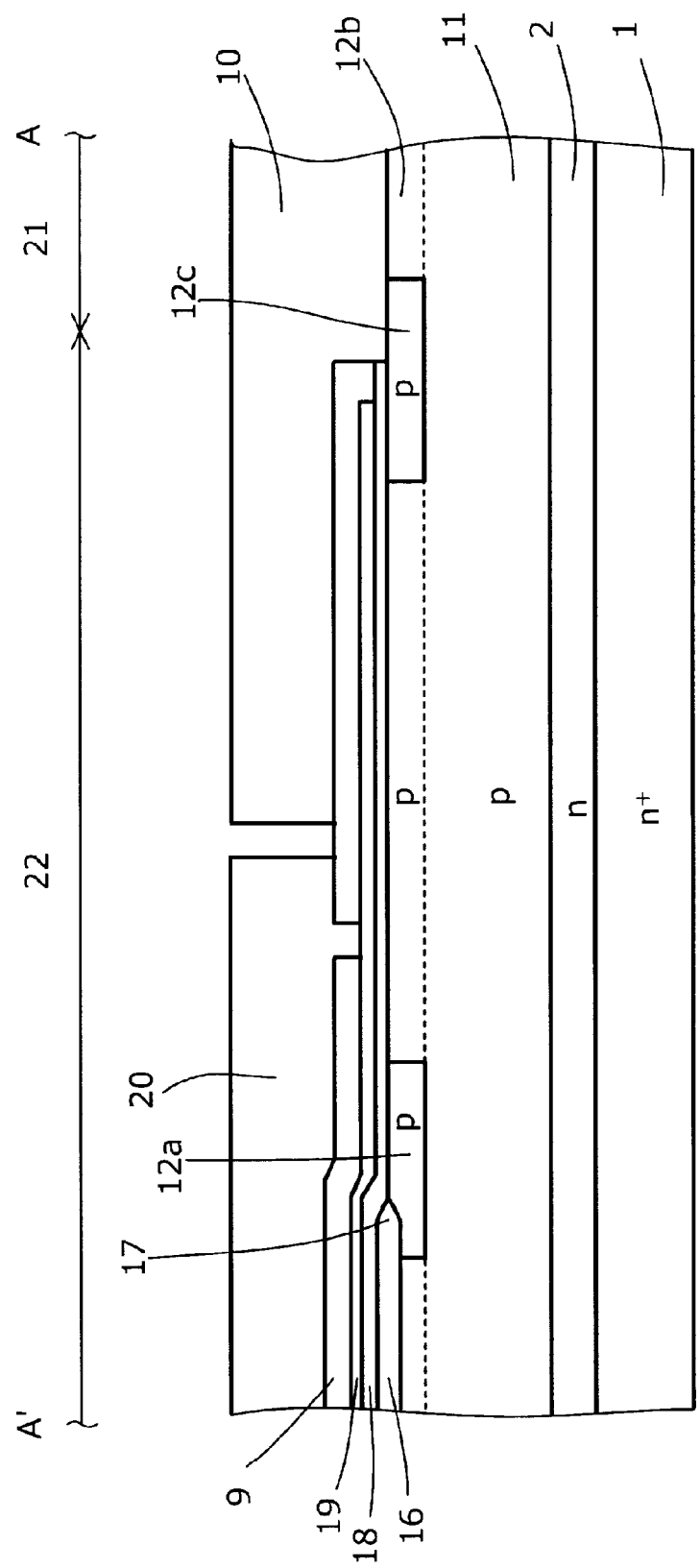
FIG. 1B is a sectional view showing a sectional structure of the semiconductor device according to the first embodiment.
Figure 1C:
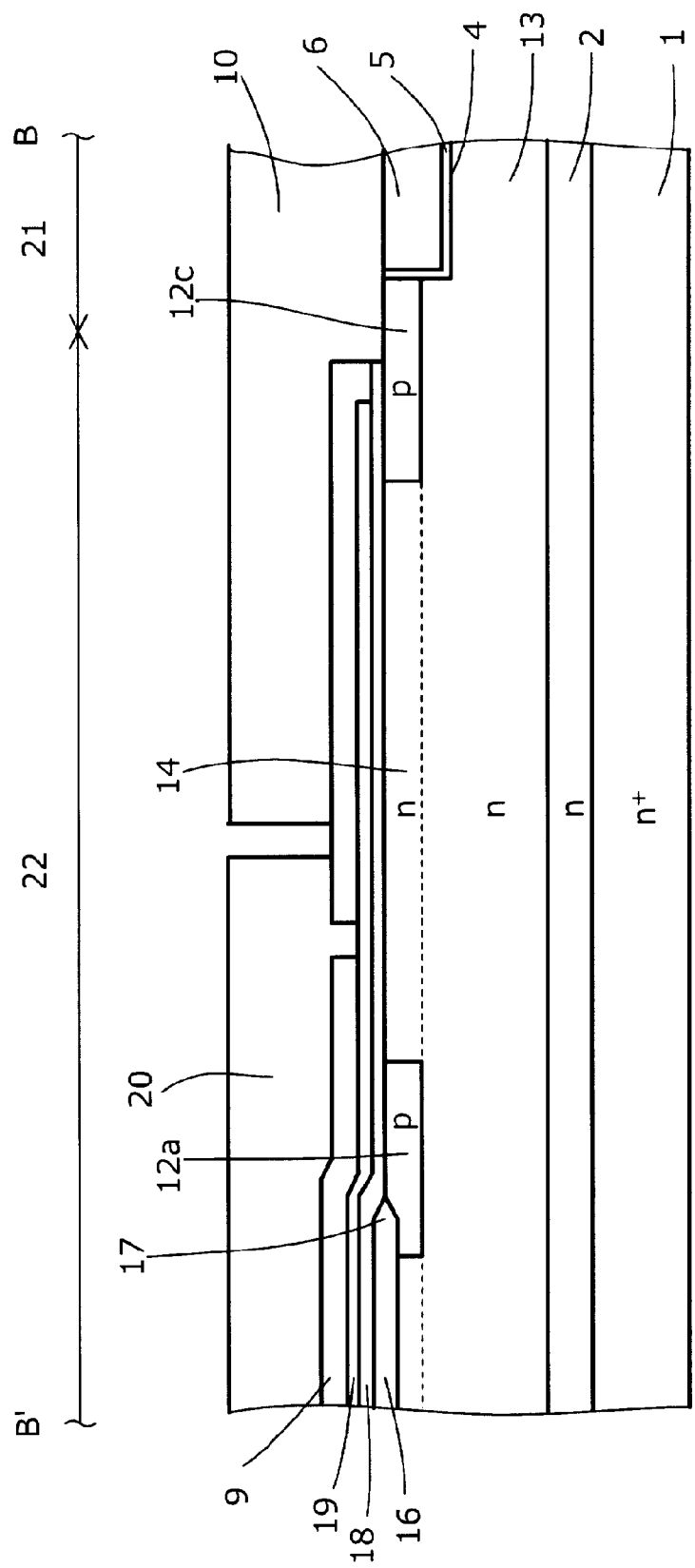
FIG. 1C is a sectional view showing a sectional structure of the semiconductor device according to the first embodiment.
Figure 2:
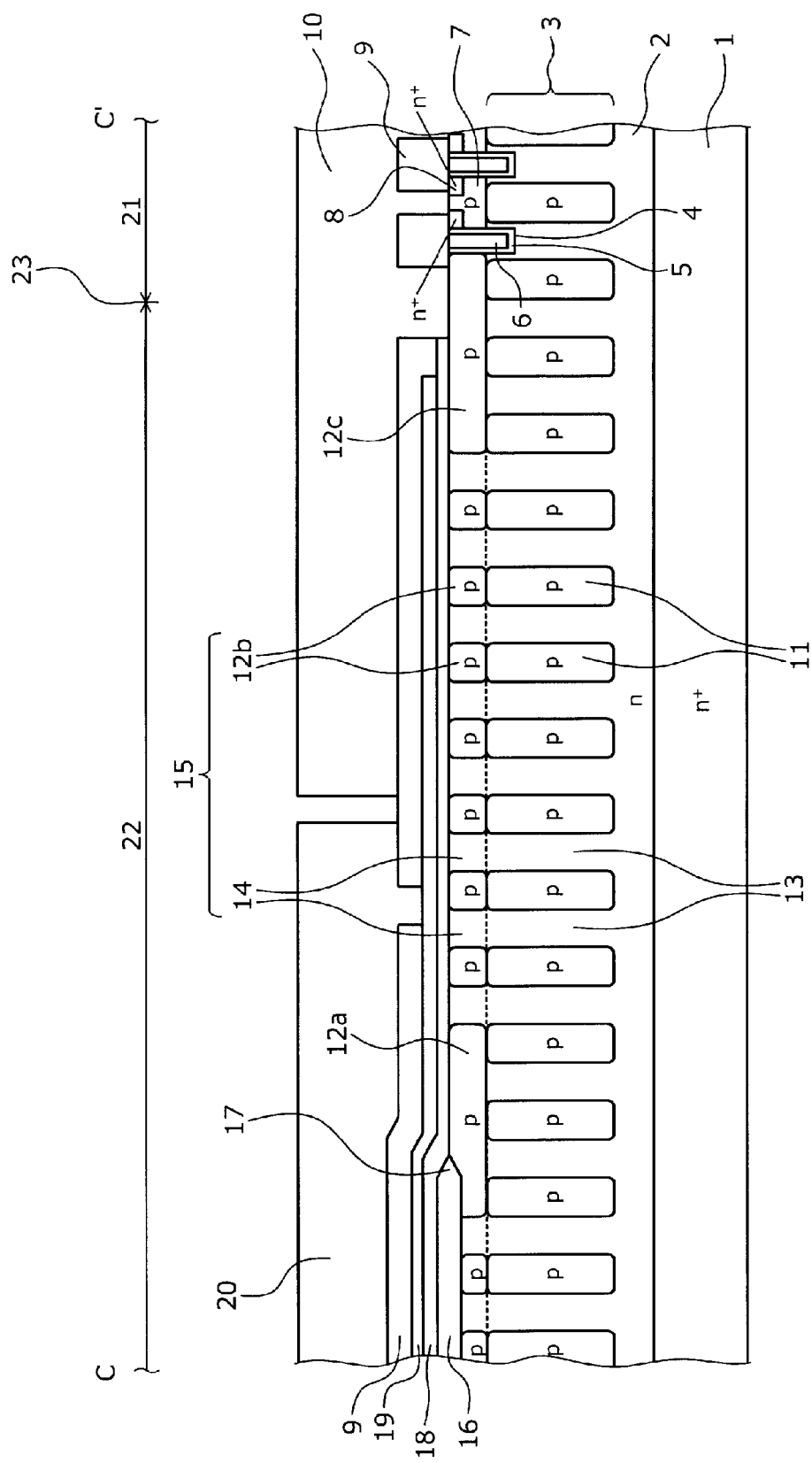
FIG. 2 is a sectional view showing a sectional structure of the semiconductor device according to the first embodiment.

A description will be given, with a vertical MOSFET of a trench gate structure as an example, of a structure of a semiconductor device according to a first embodiment. FIG. 1A is a plan view showing a planar structure of the semiconductor device according to the first embodiment. FIGS. 1B, 1C, and 2 are sectional views showing sectional structures of the semiconductor device according to the first embodiment. FIG. 1A shows a surface of a semiconductor portion of a termination structure portion 22 (a surface of a second parallel pn layer 15 configuring a super junction structure to be described hereafter) seen from the front surface side of (from above) an epitaxial base (a semiconductor chip) wherein a plurality of epitaxial layers are stacked on an $n^+$-type semiconductor substrate 1. Also, FIG. 1B shows a sectional view along A-A' of FIG. 1A, and FIG. 1C shows a sectional view along B-B' of FIG. 1A. FIG. 2 shows a sectional view along C-C' of FIG. 1A, showing a sectional structure from a MOS gate (an insulated gate formed of a metal oxide semiconductor) in an active region 21 to a stopper electrode 20 of the termination structure portion 22. The active region 21 is a region through which a current flows when in an on-state (which is in charge of a current drive). The termination structure portion 22 is a region, surrounding the active region 21, which relaxes the electric field on the front surface of the base (surface of semiconductor portion) side and maintains a breakdown voltage.

As shown in FIGS. 1A to 1C and 2, in the semiconductor device according to the first embodiment, an n-type buffer layer 2 formed of, for example, an n-type epitaxial layer is provided on the front surface of the $n^+$-type semiconductor substrate 1 forming an $n^+$-type drain region. The n-type buffer layer 2 has the function of suppressing an intrusion of impurity ions from the $n^+$-type semiconductor substrate 1 into a first parallel pn layer 3 to be described hereafter and securing the breakdown voltage of the active region 21. It is preferable that the impurity concentration of the n-type buffer layer 2 is, for example, on the order of $1 \times 10^{14}/cm^3$ or more and $1 \times 10^{16}/cm^3$ or less. It is preferable that the thickness of the n-type buffer layer 2 is, for example, 1.0 μm or more and 5.0 μm or less. The reason is that when the thickness of the n-type buffer layer 2 is out of the heretofore mentioned range, it is not possible to sufficiently exhibit the advantageous effect achieved by providing the n-type buffer layer 2. Also, the reason is that when the impurity concentration and thickness of the n-type buffer layer 2 are out of the heretofore mentioned respective ranges, an imbalance arises between a breakdown voltage and an on-resistance, and it is thus not possible to obtain good characteristics.

A super junction structure with a drift layer as the first parallel pn layer 3 in which n-type regions 13 and p-type regions 11 are alternately disposed in a direction parallel to the main surface of the base (a lateral direction) is configured on a surface of the n-type buffer layer 2 on the side opposite from the $n^+$-type semiconductor substrate 1 side. The first parallel pn layer 3 is formed of, for example, an n-type epitaxial layer. The first parallel pn layer 3 is provided from the active region 21 over to the termination structure portion 22. The first parallel pn layer 3 configures the MOS gate structure in the active region 21, and configures a breakdown voltage structure, such as a field plate, in the termination structure portion 22. The n-type regions 13 and p-type regions 11 of the first parallel pn layer 3 have the planar layout of a striped pattern in which the n-type regions 13 and p-type regions 11 extend in a direction perpendicular to the direction in which they are alternately aligned and in a direction parallel to the main surface of the base. Also, a p-type region 12a immediately below an inner side end portion of a LOCOS film, to be described hereafter, and a p-type RESURF region 12c are disposed in a concentric (annular) layout in plan view in which the p-type RESURF region 12c surrounds the periphery of the active region 21.

A common trench gate type MOS gate structure formed of a trench 4, a gate insulating film 5, a gate electrode 6, a p-type base region 7, and an $n^+$-type source region 8 is provided on the front surface side of the base of the first parallel pn layer 3 in the active region 21. Specifically, the trench 4 reaching the n-type region 13 of the first parallel pn layer 3 from the front surface of the base is provided. In the trench 4, the gate insulating film 5 is provided along the inner wall of the trench 4, and the gate electrode 6 is provided inside the gate insulating film 5. The p-type base region 7 is provided in the surface layer of the front surface of the base so as to be sandwiched between adjacent trenches 4 and be in contact with the gate insulating films 5 forming the sidewall of the trench 4. The $n^+$-type source region 8 is provided in the p-type base region 7 so as to be in contact with the gate insulating films 5 forming the sidewall of the trench 4. A $p^+$-type contact region (not shown) may be provided in the p-type base region 7.

The gate electrode 6 is covered with a first interlayer insulating film 9 made of BPSG (Boro Phospho Silicate Glass), PSG, or the like. A source electrode 10 is in contact with the p-type base region 7 (or $p^+$-type contact region) and $n^+$-type source region 8 via a contact hole passing through the first interlayer insulating film 9 in the direction of the substrate depth (a vertical direction), and is electrically insulated from the gate electrode 6 by the first interlayer insulating film 9. The outer side (chip end portion side) end portion of the source electrode 10 extends as far as and over a portion of a field plate electrode 19, to be described hereafter, which covers the second parallel pn layer 15 via the first interlayer insulating film 9. The heretofore described MOS gate structure of the active region 21 is one example, and for example, a planar gate structure wherein a MOS gate is provided in a plate form on an epitaxial base may be adopted in place of the trench gate structure. When taking into account a reduction in on-resistance achieved by a miniaturization of the first parallel pn layer 3 in a low breakdown voltage semiconductor device of a low breakdown voltage class of, for example, on the order of 100V, it is possible and advantageous to more obtain an on-resistance reduction effect by adopting the trench gate structure.

The p-type region (p-type RESURF region) 12c configuring a RESURF structure is provided on a surface on the front surface side of the base of the first parallel pn layer 3 at a boundary 23 of the active region 21 and termination structure portion 22 so as to range from the active region 21 to the termination structure portion 22. The p-type RESURF region 12c is provided, for example, over a plurality of adjacent p-type regions 11 of the first parallel pn layer 3. Also, the p-type RESURF region 12c is in contact with, for example, the gate insulating film 5 provided as the outer side sidewall of the outermost trench 4. The source electrode 10 is connected to the p-type RESURF region 12c via the contact hole passing through the first interlayer insulating film 9 in the vertical direction. In the termination structure portion 22, the source electrode 10 and the semiconductor portion (p-type RESURF region 12c) are in contact only at the boundary 23 of the termination structure portion 22 and active region 21.

In the termination structure portion 22, the second parallel pn layer 15 in which n-type regions 14 and p-type regions 12b are alternately disposed is provided on a surface on the front surface side of a base of the first parallel pn layer 3 outside the p-type RESURF region 12c. The n-type regions 14 and p-type regions 12b of the second parallel pn layer 15 are respectively disposed on the surfaces on the front surface side of the base of the n-type regions 13 and p-type regions 11 of the first parallel pn layer 3. Also, the n-type regions 14 and p-type regions 12b of the second parallel pn layer 15 are exposed to the surface of the semiconductor portion (the interface between the front surface of the base and a second interlayer insulating film 18 to be described hereafter). The sectional structure and planar layout of the second parallel pn layer 15 are the same as those of the first parallel pn layer 3. That is, a super junction structure with a drift layer as the first parallel pn layer 3 and second parallel pn layer 15 is configured in the termination structure portion 22.

The impurity concentrations of the n-type regions 14 and p-type regions 12b of the second parallel pn layer 15 are at the same level, respectively, as the impurity concentrations of the n-type regions 13 and p-type regions 11 of the first parallel pn layer 3. The impurity concentrations of the n-type regions 14 and p-type regions 12b of the second parallel pn layer 15 are set to be comparatively low so that a depletion layer extending from the pn junctions between the p-type regions 12b and the n-type regions 14 expands in the lateral direction when a voltage is applied between the source and the drain in an off-state. The LOCOS film 16, acting as a field insulating film, which is formed by, for example, a LOCOS method, is provided on the surface on the front surface side of the base (that is, the surface of the semiconductor portion) of the second parallel pn layer 15 outside the p-type RESURF region 12c so as to be spaced from the p-type RESURF region 12c. The LOCOS film 16 functions as an element isolation region which electrically isolates other elements disposed outside the termination structure portion 22.

The p-type region 12a is provided in the second parallel pn layer 15 so as to cover the lower side (semiconductor portion side) of an inner side (the inner side of the chip (active region 21 side)) end portion 17 of the LOCOS film 16 and be spaced from the p-type RESURF region 12c. The p-type region 12a passes through the second parallel pn layer 15 in the depth direction from the surface of the semiconductor portion and reaches the first parallel pn layer 3. The p-type region 12a only has to be disposed so as to include a portion below a level difference formed on the surface of the semiconductor portion by the inner side end portion (LOCOS bird's beak) 17 of the LOCOS film 16 (a portion immediately below the inner side end portion 17 of the LOCOS film 16 (a portion of the semiconductor portion in contact with the inner side end portion 17 of the LOCOS film 16)), and for example, may be provided over a plurality of adjacent p-type regions 11 of the first parallel pn layer 3 so as to have a greater width than the p-type region 11, or may be provided only on one p-type region 11 so as to have the same width as the p-type region 11.

That is, the p-type region 12a only has to be provided so as to include the portion immediately below the inner side end portion 17 of the LOCOS film 16, and it is thus possible to sufficiently increase a breakdown voltage even when the p-type region 12a is provided only on one p-type region 11 of the first parallel pn layer 3. When the p-type region 12a is provided only on one p-type region 11 of the first parallel pn layer 3, it is possible to form all the surface layer on the front surface side of the base in the termination structure portion 22 (outside the p-type RESURF region 12c) as the super junction structure by appropriately adjusting the dose amount of ion implantation (a third ion implantation 36 to be described hereafter) so that laterally adjacent p-type regions 12a and 12b do not connect together immediately below the inner side end portion 17 of the LOCOS film 16. The field plate electrode 19 is provided on one portion of the p-type RESURF region 12c, the second parallel pn layer 15, the p-type region 12a, and the LOCOS film 16 via a second interlayer insulating film 18. The field plate electrode 19 is electrically insulated from the source electrode 10 by the first interlayer insulating film 9.

The inner side end portion of the field plate electrode 19 extends on the p-type RESURF region 12c via the second interlayer insulating film 18. A stopper electrode (an EQR (EQui-potential Ring) electrode) 20 is provided on the first interlayer insulating film 9 in the outer peripheral portion of the chip so as to be spaced from the source electrode 10. The stopper electrode 20 is in contact with the field plate electrode 19 via a contact hole passing through the first interlayer insulating film 9 in the depth direction. Also, the stopper electrode 20 covers one portion of the LOCOS film 16, p-type region 12a, and second parallel pn layer 15 via the second interlayer insulating film 18, field plate electrode 19, and first interlayer insulating film 9. A drain electrode (not shown) is provided on the rear surface (rear surface of base) of the $n^+$-type semiconductor substrate 1 from the active region 21 over to the termination structure portion 22.

Figure 3:
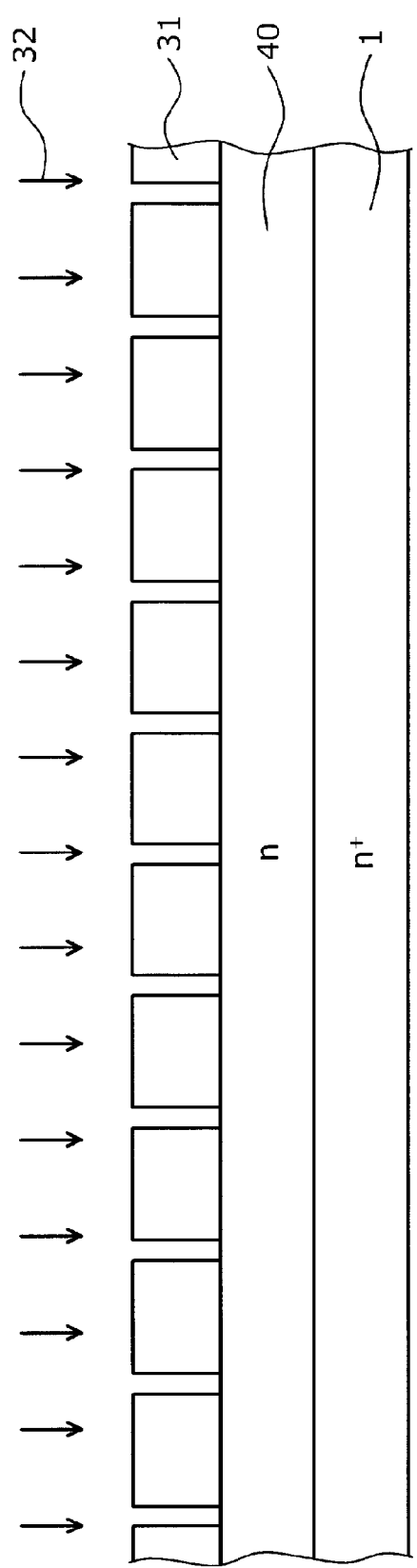
FIG. 3 is a sectional view showing a condition of the semiconductor device in the process of being manufactured according to the first embodiment.
Figure 4:
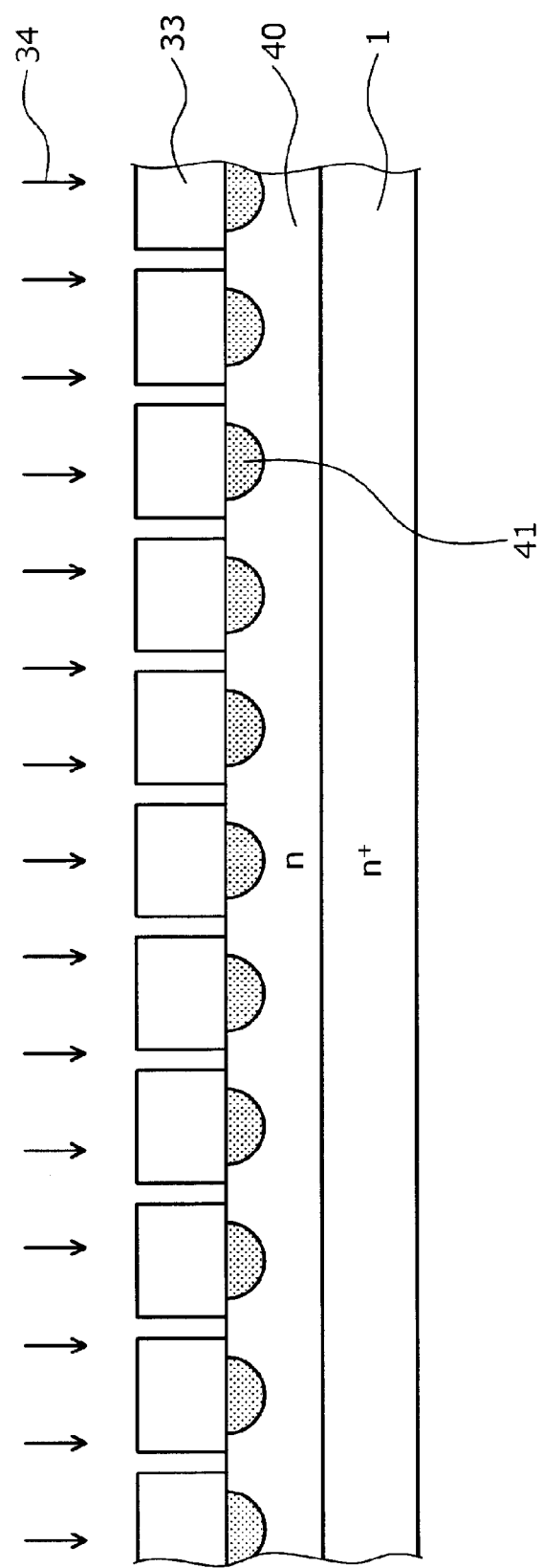
FIG. 4 is a sectional view showing a condition of the semiconductor device in the process of being manufactured according to the first embodiment.

Next, a description will be given of a semiconductor device manufacturing method according to the first embodiment. FIGS. 3 to 6 are sectional views showing conditions of the semiconductor device according to the first embodiment in the process of being manufactured. FIGS. 3 to 6 show a portion of the termination structure portion 22, shown in FIG. 2, outside the p-type RESURF region 12c. Firstly, as shown in FIG. 3, an n-type epitaxial layer 40 is deposited on the front surface of the $n^+$-type semiconductor substrate (a semiconductor wafer) 1 by an epitaxial growth method. Next, a resist mask 31, portions of which corresponding to regions of the first parallel pn layer 3 in which to form the n-type regions 13 are open, is formed on the n-type epitaxial layer 40 by photolithography and etching. Next, a first ion implantation 32 of n-type impurities is performed with the resist mask 31 as a mask. By the first ion implantation 32, n-type impurity regions 41 forming the n-type regions 13 of the first parallel pn layer 3 are formed in the surface layer of the n-type epitaxial layer 40, as shown in FIG. 4 (the dot-shaded portions).

Figure 5:
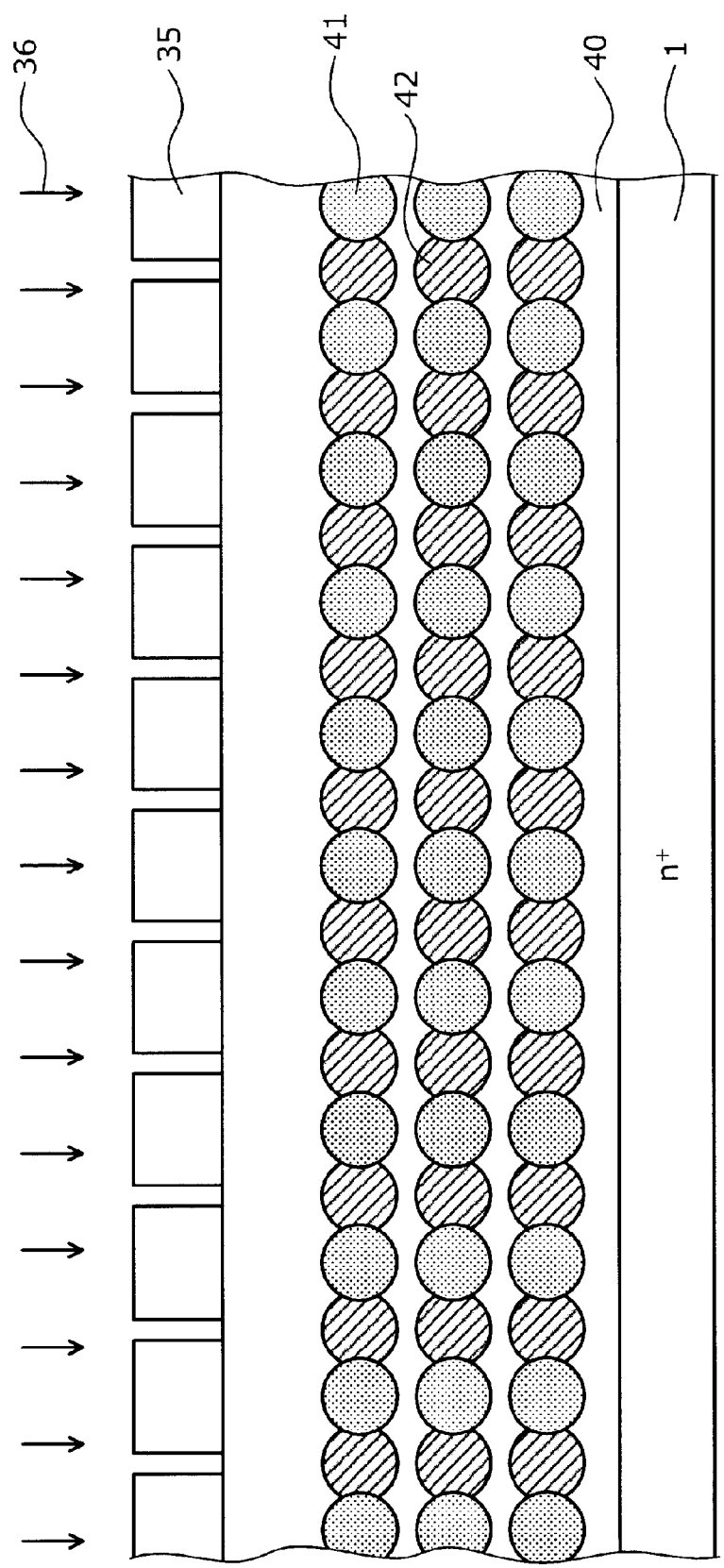
FIG. 5 is a sectional view showing a condition of the semiconductor device in the process of being manufactured according to the first embodiment.

Next, after removing the resist mask 31, a resist mask 33, portions of which corresponding to regions of the first parallel pn layer 3 in which to form the p-type regions 11 are open, is formed on the n-type epitaxial layer 40 by photolithography and etching. Next, a second ion implantation 34 of p-type impurities is performed with the resist mask 33 as a mask. By the second ion implantation 34, p-type impurity regions 42 forming the p-type regions 11 of the first parallel pn layer 3 are formed in the surface layer of the n-type epitaxial layer 40, as shown in FIG. 5 (the diagonally hatched portions). That is, the n-type impurity regions 41 and the p-type impurity regions 42 are alternately disposed in the lateral direction in the surface layer of the n-type epitaxial layer 40. The deposition of the n-type epitaxial layer 40 and the formation of the n-type impurity regions 41 and p-type impurity regions 42 are repeatedly carried out, thus causing the total thickness of a plurality of stacked n-type epitaxial layers 40 to reach a predetermined thickness (for example, the thickness of the first parallel pn layer 3). The order of forming the n-type impurity regions 41 and p-type impurity regions 42 in the first n-type epitaxial layer 40 is reversible.

Next, an n-type epitaxial layer forming an uppermost layer (hereafter referred to as the uppermost n-type epitaxial layer 40) is newly deposited on the n-type epitaxial layer 40. By so doing, the total thickness of the plurality of stacked n-type epitaxial layers 40 reaches, for example, a product thickness (the thickness of the epitaxial base). Next, a resist mask 35, which is open in predetermined positions, is formed on the front surface of the base (the n-type epitaxial layer 40 side surface of the epitaxial base) by photolithography and etching. The resist mask 35 has opening portions in respective portions corresponding to regions in which to form the p-type RESURF region 12c, the p-type regions 12b of the second parallel pn layer 15, and the p-type region 12a immediately below the inner side end portion 17 of the LOCOS film 16 to be formed in a subsequent step. As the LOCOS film 16 is not yet formed on the front surface of the base when forming the resist mask 35, no level difference formed by the LOCOS film 16 exists on the surface of the uppermost n-type epitaxial layer 40. Consequently, it is possible to accurately form the microscopically patterned resist mask 35 without causing a pattern defect.

Figure 6:
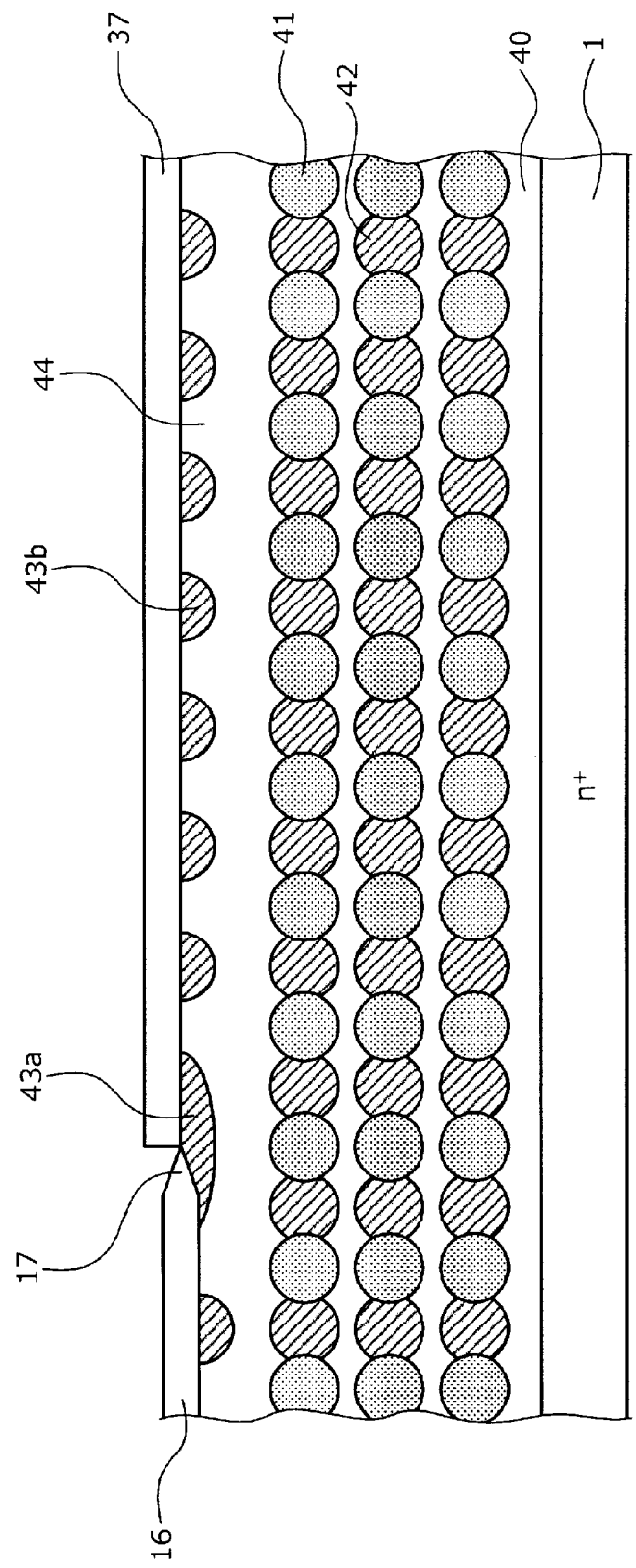
FIG. 6 is a sectional view showing a condition of the semiconductor device in the process of being manufactured according to the first embodiment.

Next, the third ion implantation 36 of p-type impurities is performed with the resist mask 35 as a mask. By the third ion implantation 36, a p-type impurity region (not shown) forming the p-type RESURF region 12c, p-type impurity regions 43b forming the p-type regions 12b of the second parallel pn layer 15, and a p-type impurity region 43a forming the p-type region 12a immediately below the inner side end portion 17 of the LOCOS film 16 are formed in the surface layer of the uppermost n-type epitaxial layer 40, as shown in FIG. 6 (the uppermost hatched portions). The third ion implantation 36 is, for example, known ion implantation for forming the p-type RESURF region 12c. Therefore, it is possible to form the p-type regions 12a and 12b at the same time as the p-type RESURF region 12c without increasing the number of processes. Also, a portion on which no n-type impurity ion implantation for forming the n-type impurity regions 41 is carried out and into which no p-type impurity is introduced (that is, a portion covered with the resist mask 35. Hereafter referred as to the n-type region) 44 is left as the n-type regions 14 of the second parallel pn layer 15 in the uppermost n-type epitaxial layer 40. By so doing, it is possible to reduce the number of processes.

In the first, second, and third ion implantations 32, 34, and 36 for forming the first and second parallel pn layers 3 and 15, the n-type impurity regions 41 and p-type impurity regions 42, 43a, and 43b formed in the surface layer of a newly deposited upper n-type epitaxial layer 40 are disposed in respective positions opposed in the vertical direction to the n-type impurity regions 41 and p-type impurity regions 42 formed in the surface layer of the lower n-type epitaxial layer 40. The vertically opposed n-type impurity regions 41 connect together in the vertical direction, and the vertically opposed p-type impurity regions 42, 43a, and 43b connect together in the vertical direction, in a diffusion step when forming a MOS gate structure to be described hereafter. Therefore, at the points of the first, second, and third ion implantations 32, 34, and 36, the n-type impurity regions 41 and p-type impurity regions 42, 43a, and 43b forming the upper n-type epitaxial layer 40 do not have to be respectively in contact with the vertically opposed n-type impurity regions 41 and p-type impurity regions 42 of the lower n-type epitaxial layer 40. In this case, the dose amounts and acceleration energies of the first, second, and third ion implantations 32, 34, and 36 only have to be set so that the n-type impurity regions 41 and p-type impurity regions 42 formed in a newly deposited n-type epitaxial layer 40 are spaced from the n-type impurity regions 41 and p-type impurity regions 42 opposed thereto in the depth direction. Specifically, the dose amount and acceleration energy of the first and second ion implantations 32 and 34 are, for example, $1.5 \times 10^{13}/cm^2$ and 150 keV for phosphorus (P) and $1.5 \times 10^{13}/cm^2$ and 100 keV for boron (B). Also, the dose amount and acceleration energy of the third ion implantation 36 are for example, $5.0 \times 10^{13}/cm^2$ and 50 keV.

Also, the epitaxial growth of the n-type epitaxial layer 40 is preferably carried out at a low temperature of, for example, on the order of 1100° C. or less in the same way as an oxide film growth (heat treatment for forming the LOCOS film 16) to be described hereafter. That is, the heretofore described epitaxial growth and the oxide film growth to be described hereafter are preferably carried out at a low temperature which suppresses (hardly allows) the diffusion of the n-type impurity regions 41, n-type regions 44, and p-type impurity regions 42, 43a, and 43b. The reason is that it is possible to prevent the laterally adjacent p-type impurity regions 42 from connecting together and the laterally adjacent p-type impurity regions 43a and 43b from connecting together, and prevent the n-type impurity regions 41 and the n-type regions 44 from disappearing. Also, the reason is that it is possible to reduce on-resistance by suppressing an impurity diffusion in the semiconductor portion, and maintaining the vertically opposed n-type impurity regions 41 and the vertically opposed p-type impurity regions 42, 43a, and 43b as much as possible in substantially the same condition as when forming each of the regions, that is, in a condition in which the regions are spaced from one another, during the epitaxial growth and oxide film growth.

Next, a nitride film 37 is formed on the front surface of the base by a decompression CVD method. Next, the nitride film 37 is selectively removed by photolithography and etching, thus exposing a portion of the n-type epitaxial layer 40 corresponding to a region in which to form the LOCOS film 16. Next, the LOCOS film 16 is formed in the exposed portion of the n-type epitaxial layer 40 with the remaining portion of the nitride film 37 as a mask by, for example, pyrogenic oxidation (heat treatment) (a second heat treatment step). At this time, the LOCOS film 16 is formed so that the inner side end portion 17 of the LOCOS film 16 is positioned on the p-type impurity region 43a forming the p-type region 12a. It is preferable to form the LOCOS film 16 by thermal oxidation such as pyrogenic oxidation because it is thereby possible to enhance the adhesion of the LOCOS film 16 to the semiconductor portion.

Also, the heat treatment for forming the LOCOS film 16 is preferably carried out for a long time at a low temperature which suppresses the diffusion of the n-type impurity regions 41, n-type regions 44, and p-type impurity regions 42, 43a, and 43b so that the laterally adjacent p-type impurity regions 42 do not connect together, nor do the laterally adjacent p-type impurity regions 43a and 43b, and the n-type impurity regions 41 and the n-type regions 44 do not disappear, and that the vertically opposed n-type impurity regions 41 and the vertically opposed p-type impurity regions 42, 43a, and 43b are maintained spaced from one another (do not connect together). Specifically, heat treatment conditions for forming the LOCOS film 16 are preferably that, for example, the heat treatment temperature is set to on the order of 1000° C. or less, and the heat treatment time is set to on the order of 200 minutes or more and 350 minutes or less. An oxide film growth by the heat treatment at such a low temperature for such a long time is effective especially when the width (repetitive pitch) of the n-type regions 13 and 14 and p-type regions 11 and 12b of the first and second parallel pn layers 3 and 15 is 3.0 µm or less. Meanwhile, when the heat treatment temperature is too low, it is not possible to sufficiently obtain the thickness of the LOCOS film 16. Therefore, it is preferable that the heat treatment temperature for forming the LOCOS film 16 is on the order of 950° C. or more.

Next, the MOS gate structure of the active region 21 is formed after removing the nitride film 37. Specifically, when forming, for example, a trench gate type MOS gate structure in the active region 21, firstly, a resist mask (not shown), a portion of which corresponding to a regios in which to form the trench 4 is open, is formed on the front surface of the base by photolithography and etching. Next, etching is carried out with the resist mask as a mask, and the trench 4 is formed from the front surface of the base to a depth greater than the thickness of the uppermost n-type epitaxial layer 40. Next, the resist mask used in forming the trench 4 is removed. Next, an insulating film is formed along the surface of the uppermost n-type epitaxial layer 40 and the inner wall of the trench 4, and a polysilicon (poly-Si) layer is deposited on the insulating film so as to be embedded in the trench 4. Further, the polysilicon layer is patterned.

The insulating film formed along the inner wall of the trench 4 is the gate insulating film 5, and the polysilicon layer embedded in the trenches 4 is the gate electrode 6. At this time, for example, in the termination structure portion 22, the insulating layer formed on the surface of the n-type epitaxial layer 40 forms the second interlayer insulating film 18, and the polysilicon layer deposited on the insulating film forming the second interlayer insulating film 18 forms the field plate electrode 19. Next, a resist mask (not shown), a portion of which corresponding to a region in which to form the p-type base region 7 is open, is formed on the front surface of the base by photolithography and etching. Next, p-type impurity ion implantation is carried out with the resist mask as a mask, and the p-type base region 7 is formed in the surface layer of the uppermost n-type epitaxial layer 40 to a depth the same as the thickness of the uppermost n-type epitaxial layer 40.

Next, after removing the resist mask used in forming the p-type base region 7, the p-type base region 7 is diffused by heat treatment (drive-in) (the second heat treatment step). In this thermal diffusion treatment of the p-type base region 7, the p-type impurity region forming the p-type RESURF region 12c, the p-type impurity regions 43b forming the p-type regions 12b of the second parallel pn layer 15, and the p-type impurity region 43a forming the p-type region 12a immediately below the inner side end portion 17 of the LOCOS film 16, are diffused at the same time as diffusing the p-type base region 7. By so doing, the n-type impurity regions 41 vertically opposed in the plurality of stacked n-type epitaxial layers 40 connect together, and the p-type impurity regions 42, 43a, and 43b vertically opposed therein connect together. By so doing, the n-type regions 13 and 14 and p-type regions 11 and 12b of the first and second parallel pn layers 3 and 15 are formed. The n-type epitaxial layer 40 left in a portion sandwiched between the first and second parallel pn layers 3 and 15 and the n$^+$-type semiconductor substrate 1 forms the n-type buffer layer 2.

In this way, heat treatment conditions in each step are set before the thermal diffusion treatment of the p-type base region 7 so that the vertically opposed n-type impurity regions 41 do not connect together, nor do the vertically opposed the p-type impurity regions 42. Specifically, an impurity diffusion in the semiconductor portion from the formation of the LOCOS film 16 until before the thermal diffusion treatment of the p-type base region 7 is suppressed by carrying out the heat treatment for forming the LOCOS film 16 at a low temperature and by omitting the thermal diffusion treatment of the p-type RESURF region 12c. Further, the n-type regions 13 and 14 and p-type regions 11 and 12b of the first and second parallel pn layers 3 and 15 are formed by connecting the vertically opposed n-type impurity regions 41 together and connecting the vertically opposed p-type impurity regions 42, 43a, and 43b together using the thermal diffusion treatment of the p-type base region 7. By so doing, it is possible to suppress an increase in on-resistance due to an adverse effect of the impurity diffusion in the semiconductor portion.

Next, a resist mask (not shown), a portion of which corresponding to a region in which to form a p$^+$-type contact region (not shown) is open, is formed on the front surface of the base by photolithography and etching. Next, p-type impurity ion implantation is carried out with the resist mask as a mask, thus forming the p$^+$-type contact region in the p-type base region 7. Next, after removing the resist mask used in forming the p$^+$-type contact region, a resist mask (not shown), a portion of which corresponding to a region in which to form the n$^+$-type source region 8 is open, is formed on the front surface of the base. Next, n-type impurity ion implantation is carried out with the resist mask as a mask, thus forming the n$^+$-type source region 8 in the p-type base region 7. Next, after removing the resist mask used in forming the n$^+$-type source region 8, the front surface of the base is covered with the first interlayer insulating film 9.

Next, the insulating film (the insulating film forming the gate insulating film 5 and second interlayer insulating film 18) and first interlayer insulating film 9 on the front surface of the base are patterned by photolithography and etching, thus forming a contact hole to which are exposed the n$^+$-type source region 8 and the p$^+$-type contact region, a contact hole to which is exposed the p-type RESURF region 12c, and a contact hole to which is exposed one portion of the field plate electrode 19. Next, a metal electrode is formed on the front surface of the base so as to be embedded in the contact holes. Next, the metal electrode is patterned by photolithography and etching, thus forming the source electrode 10, the stopper electrode 20, and a gate pad (not shown). Subsequently, the epitaxial base is diced (cut) into chips, thereby completing the super junction semiconductor device shown in FIGS. 1A to 1C and 2.

As heretofore described, according to the first embodiment, as the LOCOS film is formed after carrying out the ion implantation for forming the first parallel pn layer in the n-type epitaxial layer, and furthermore, carrying out the ion implantation for forming the p-type RESURF region, the p-type regions of the second parallel pn layer, and the p-type region immediately below the inner side end portion of the LOCOS film in the uppermost n-type epitaxial layer, no level difference formed by the LOCOS film exists on the surface of the semiconductor portion when carrying out the ion implantation for forming each p-type region in the uppermost n-type epitaxial layer. Therefore, when fabricating, for example, a low breakdown voltage power device, it is possible to accurately form an ion implantation mask without causing a pattern defect even when achieving a miniaturization of parallel pn layers. Therefore, it is possible to accurately form the second parallel pn layer reaching the surface of the semiconductor portion in the termination structure portion, and it is thus possible to increase the breakdown voltage of the termination structure portion. Also, at the same time as when forming the second parallel pn layer, the p-type region can be formed so as to cover the level difference formed by the LOCOS film on the surface of the semiconductor portion, meaning that it is possible to relax the electric field concentration immediately below the inner side end portion of the LOCOS film, and it is thus possible to further increase the breakdown voltage of the termination structure portion. Consequently, it is possible to make the breakdown voltage of the termination structure portion higher than the breakdown voltage of the active region, and it is thus possible to increase the breakdown voltage of the whole of the element. Also, according to the first embodiment, as the LOCOS film is formed by low temperature heat treatment, and the p-type RESURF region, the respective regions of the first and second parallel pn layers, and the p-type region immediately below the inner side end portion of the LOCOS film are collectively diffused when thermally diffusing the p-type base region, it is possible to suppress an excess impurity diffusion in the semiconductor portion heretofore caused by the formation of the LOCOS film or the like. Therefore, it is possible to prevent the first and second parallel pn layers from disappearing, meaning that it is possible to obtain a low on-resistance effect brought about by the first and second parallel pn layers. Consequently, it is possible to realize low on-resistance and increase the breakdown voltage of the whole of the element.

Embodiment 2

Figure 7:
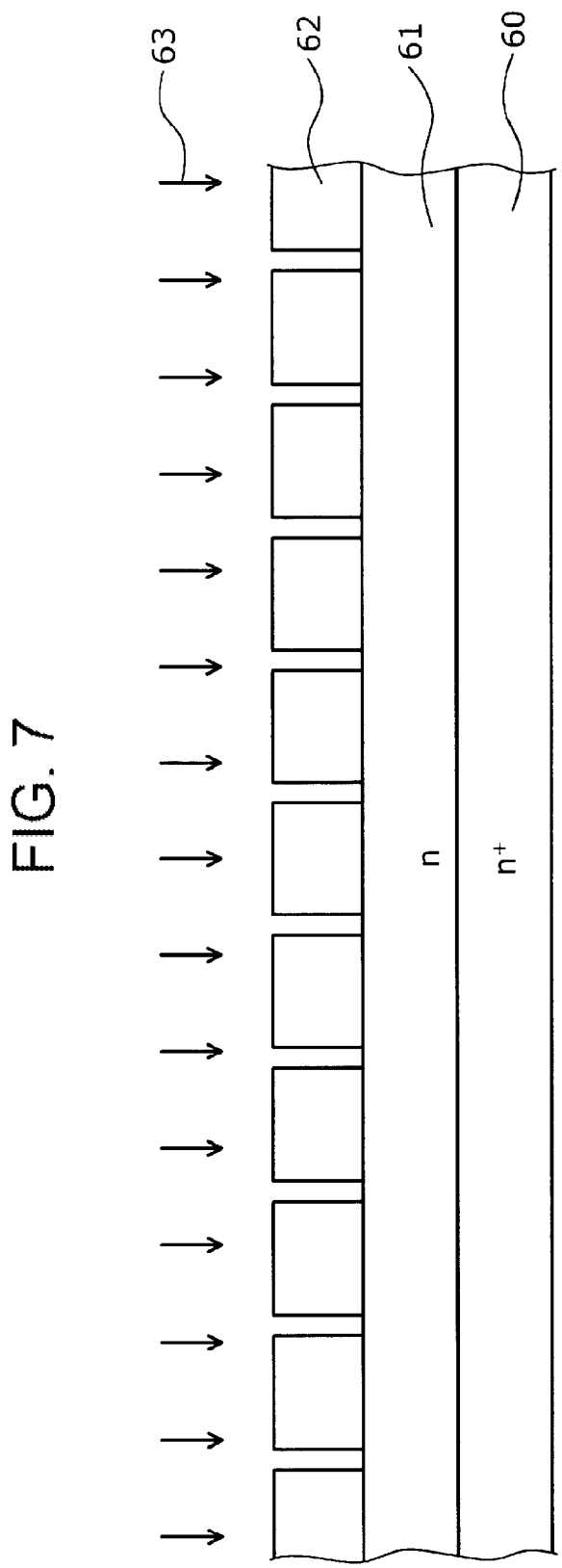
FIG. 7 is a sectional view showing a condition of the semiconductor device in the process of being manufactured according to a second embodiment.
Figure 8:
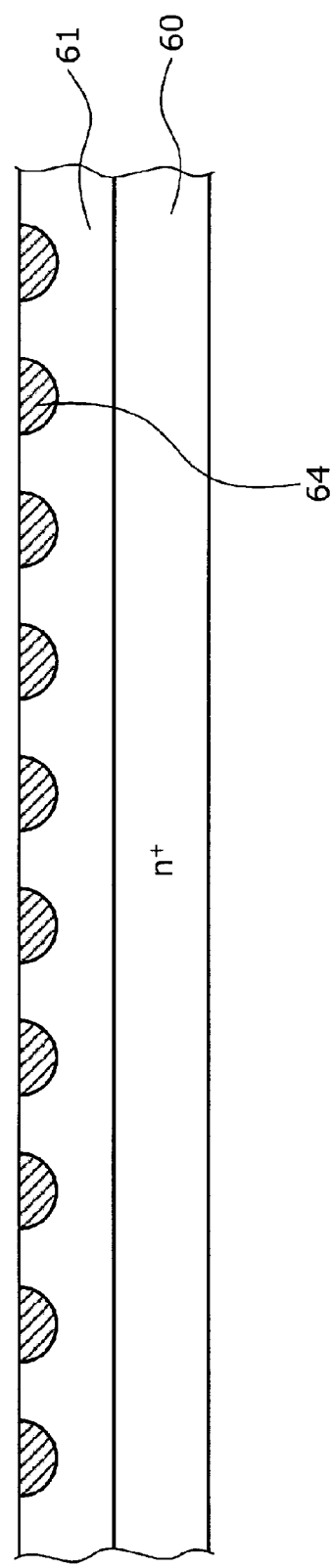
FIG. 8 is a sectional view showing a condition of the semiconductor device in the process of being manufactured according to the second embodiment.

A description will be given of a semiconductor device manufacturing method according to a second embodiment. FIGS. 7 to 10 are sectional views showing conditions of the semiconductor device in the process of being manufactured according to the second embodiment. FIGS. 7 to 10 show a portion of the termination structure portion 22 outside the p-type RESURF region 12c. The structure of the semiconductor device according to the second embodiment is the same as in the first embodiment (refer to FIGS. 1A to 1C and 2. Firstly, an n-type epitaxial layer 61 is deposited on the front surface of an n$^+$-type semiconductor substrate (a semiconductor wafer) 60 by an epitaxial growth method, as shown in FIG. 7. Next, a resist mask 62, portions of which corresponding to regions in which to form the p-type regions 11 of the first parallel pn layer 3 are open, is formed on the n-type epitaxial layer 61 by photolithography and etching. Next, a fourth ion implantation 63 of p-type impurities is performed with the resist mask 62 as a mask. By the fourth ion implantation 63, p-type impurity regions 64 forming the p-type regions 11 of the first parallel pn layer 3 are formed in the surface layer of the n-type epitaxial layer 61, as shown in FIG. 8 (the diagonally hatched portions). That is, the difference from the semiconductor device manufacturing method according to the first embodiment is that only the p-type impurity regions 64 are repeatedly disposed in the lateral direction in the surface layer of the n-type epitaxial layer 61. The deposition of the n-type epitaxial layer 61, the formation of the p-type impurity regions 64, and the removal of the resist mask 62 are repeatedly carried out, thus causing the total thickness of a plurality of stacked n-type epitaxial layers 61 to reach a predetermined thickness (for example, the thickness of the first parallel pn layer 3).

Figure 9:
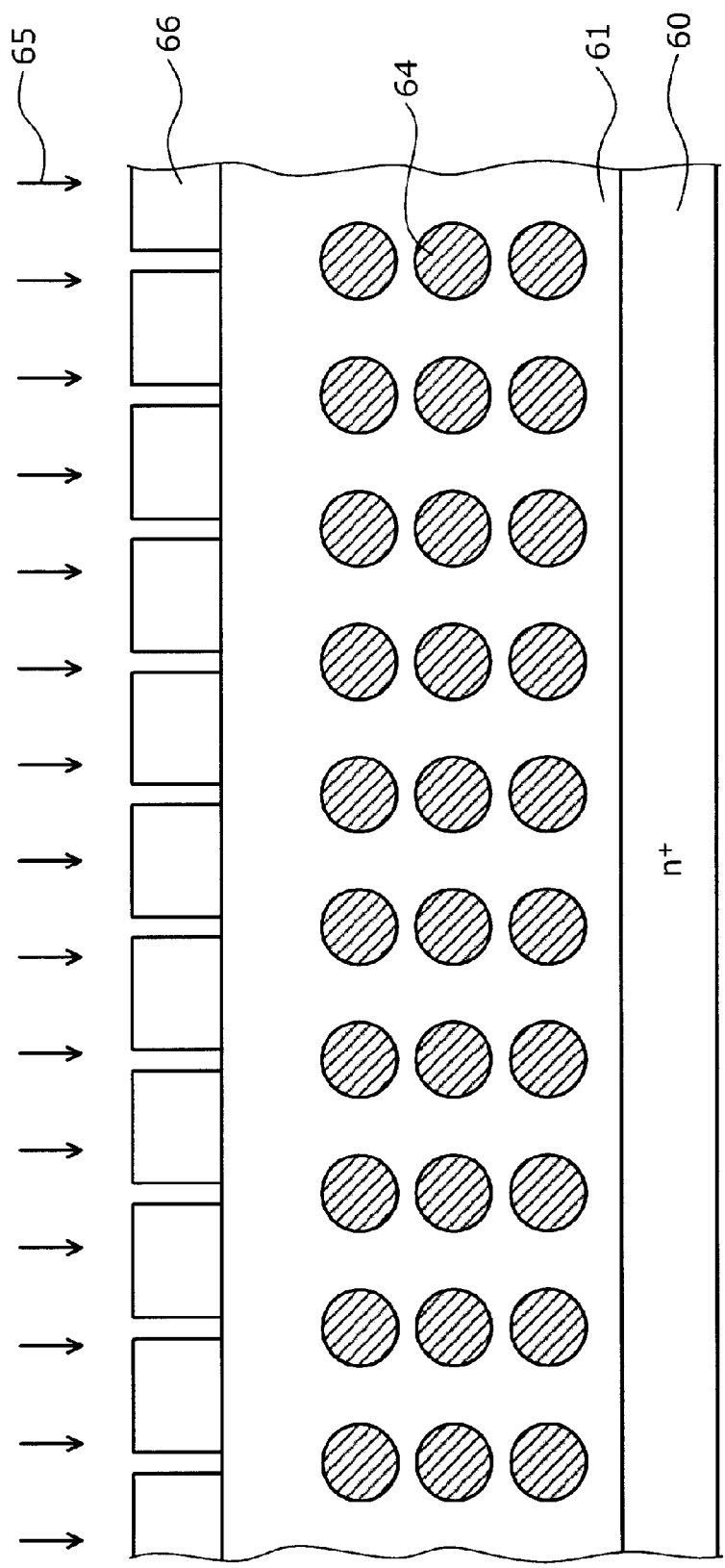
FIG. 9 is a sectional view showing a condition of the semiconductor device in the process of being manufactured according to the second embodiment.

Next, an n-type epitaxial layer forming the uppermost layer (hereafter referred to as the uppermost n-type epitaxial layer 61) is newly deposited on the n-type epitaxial layer 61, as shown in FIG. 9. By so doing, the total thickness of the plurality of stacked n-type epitaxial layers 61 reaches, for example, a product thickness (the thickness of the epitaxial base). Next, a resist mask 66, which is open in predetermined positions, is formed on the front surface of the base (the n-type epitaxial layer 61 side surface of the epitaxial base) by photolithography and etching. The resist mask 66 has opening portions in respective portions thereof corresponding to regions in which to form the p-type RESURF region 12c, the p-type regions 12b of the second parallel pn layer 15, and the p-type region 12a immediately below the inner side end portion 17 of the LOCOS film 16 to be formed in a subsequent step. As the LOCOS film 16 is not yet formed on the front surface of the base when forming the resist mask 66, no level difference formed by the LOCOS film 16 exists on the surface of the uppermost n-type epitaxial layer 61. Consequently, it is possible to accurately form the microscopically patterned resist mask 66 without causing a pattern defect, in the same way as in the first embodiment.

Figure 10:
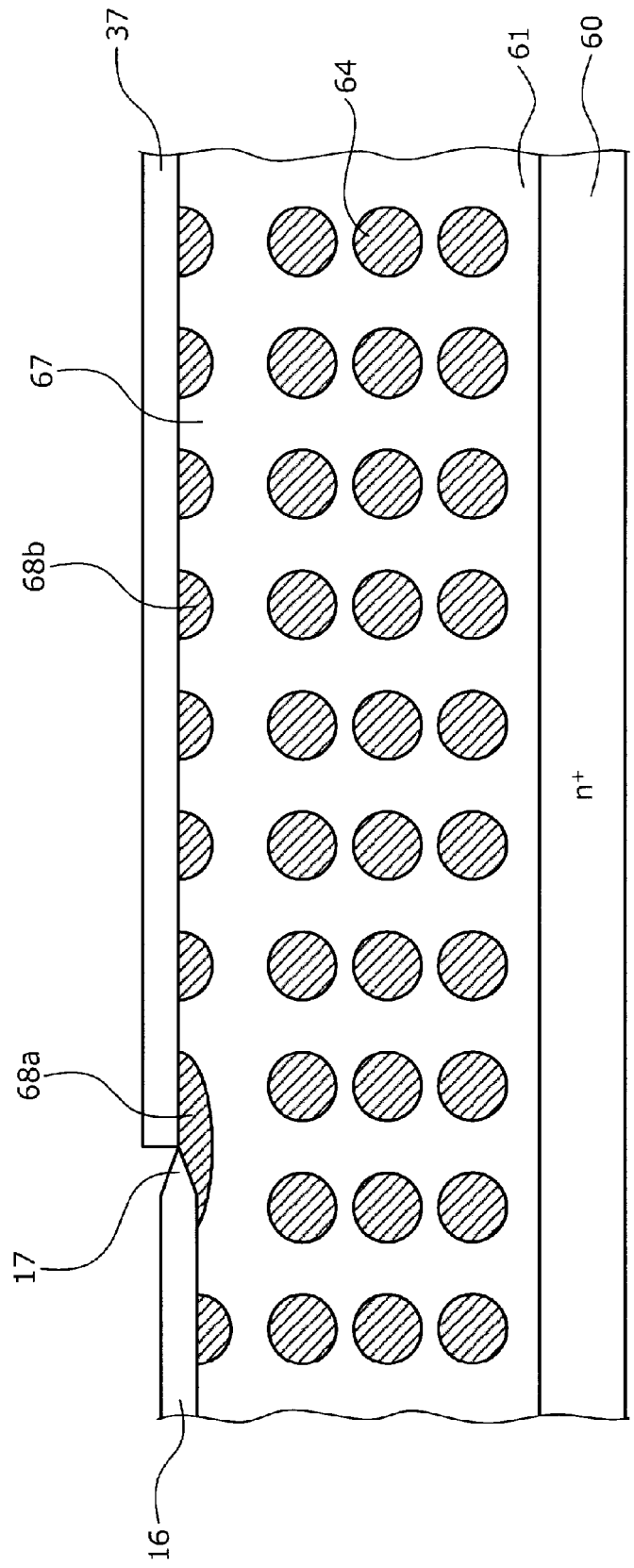
FIG. 10 is a sectional view showing a condition of the semiconductor device in the process of being manufactured according to the second embodiment.

Next, a fifth ion implantation 65 of p-type impurities is performed with the resist mask 66 as a mask. By the fifth ion implantation 65, a p-type impurity region (not shown) forming the p-type RESURF region 12c, p-type impurity regions 68b forming the p-type regions 12b of the second parallel pn layer 15, and a p-type impurity region 68a forming the p-type region 12a immediately below the inner side end portion 17 of the LOCOS film 16 are formed in the surface layer of the uppermost n-type epitaxial layer 61, as shown in FIG. 10 (the uppermost hatched portions). The fifth ion implantation 65 is, for example, known ion implantation for forming the p-type RESURF region 12c. Therefore, it is possible to form the p-type regions 12a and 12b at the same time as the p-type RESURF region 12c without increasing the number of processes. Also, portions into which no p-type impurities are introduced (that is, portions covered with the resist mask 66. Hereafter referred to as n-type regions) 67 are left as the n-type regions 14 of the second parallel pn layer 15 in the uppermost n-type epitaxial layer 61. Furthermore, no ion implantation for forming the n-type impurity regions in the surface layer of the n-type epitaxial layer 61 is carried out when forming the first parallel pn layer 3. By so doing, it is possible to reduce the number of processes.

In the fourth and fifth ion implantations 63 and 65 for forming the first and second parallel pn layers 3 and 15, the p-type impurity regions 64, 68a, and 68b formed in the surface layer of a newly deposited upper n-type epitaxial layer 61 are disposed in positions vertically opposed to the respective p-type impurity regions 64 formed in the surface layer of the lower n-type epitaxial layer 61. The vertically opposed p-type impurity regions 64, 68a, and 68b connect together in the vertical direction in a diffusion step when forming a MOS gate structure to be described hereafter. Therefore, at the points of the fourth and fifth ion implantations 63 and 65, the p-type impurity regions 64, 68a, and 68b formed in the upper n-type epitaxial layer 61 do not have to be in contact with the respective vertically opposed p-type impurity regions 64 of the lower n-type epitaxial layer 61. In this case, the dose amounts and acceleration energies of the fourth and fifth ion implantations 63 and 65 only have to be set so that the p-type impurity regions 64 opposed in the depth direction to the respective p-type impurity regions 64 formed in the newly deposited n-type epitaxial layer 61 are spaced from one another. The dose amount and acceleration energy of the fourth ion implantation 63 are, for example, on the order of $1.5 \times 10^{13}/cm^{-2}$ and 100 keV for boron. Also, the dose amount and acceleration energy of the fifth ion implantation 65 are, for example, on the order of $5.0 \times 10^{13}/cm^{-2}$ and 50 keV.

Also, the epitaxial growth of the n-type epitaxial layer 61 is preferably carried out at a low temperature of, for example, on the order of 1100° C. or less in the same way as an oxide film growth (the heat treatment for forming the LOCOS film 16) to be described hereafter. That is, the heretofore described epitaxial growth and the oxide film growth to be described hereafter are preferably carried out at a low temperature which suppresses (hardly allows) the diffusion of the p-type impurity regions 64, 68a, and 68b. The reason is that it is possible to prevent the laterally adjacent p-type impurity regions 64 from connecting together and the p-type impurity regions 68a and 68b from connecting together. Also, the reason is that it is possible to reduce on-resistance by suppressing an impurity diffusion in the semiconductor portion and maintaining the vertically opposed p-type impurity regions 64, 68a, and 68b as much as possible in substantially the same condition as when forming each of the same regions, that is, in a condition in which they are spaced from one another, during the epitaxial growth and the oxide film growth.

Next, a nitride film 37 is formed on the front surface of the base by a decompression CVD method. Next, the nitride film 37 is selectively removed by photolithography and etching, thus exposing a portion of the n-type epitaxial layer 61 corresponding to a region in which to form the LOCOS film 16. Next, the LOCOS film 16 is formed in the exposed portion of the n-type epitaxial layer 61 with the remaining portion of the nitride film 37 as a mask by, for example, pyrogenic oxidation (heat treatment) (the second heat treatment step). At this time, the LOCOS film 16 is formed so that the inner side end portion 17 of the LOCOS film 16 is positioned on the p-type impurity region 68a forming the p-type region 12a. It is preferable to form the LOCOS film 16 by thermal oxidation such as pyrogenic oxidation because it is thereby possible to enhance the adhesion of the LOCOS film 16 to the semiconductor portion.

Also, the heat treatment for forming the LOCOS film 16 is preferably carried out, as heretofore described, for a long time at a low temperature which suppresses the diffusion of the p-type impurity regions 64, 68a, and 68b so that the laterally adjacent p-type impurity regions 64 do not connect together, nor do the laterally adjacent p-type impurity regions 68a and 68b, and that the vertically opposed p-type impurity regions 64, 68a, and 68b are maintained spaced from one another. Specifically, heat treatment conditions for forming the LOCOS film 16 are preferably that, for example, the heat treatment temperature is set to on the order of 1000° C. or less, and the heat treatment time is set to on the order of 200 minutes or more and 350 minutes or less. An oxide film growth by the heat treatment at such a low temperature for such a long time is effective especially when the distance (pitch) between the p-type regions 11 and 12b of the first and second parallel pn layers 3 and 15 is 3.0 μm or less. Meanwhile, when the heat treatment temperature is too low, it is not possible to sufficiently obtain the thickness of the LOCOS film 16. Therefore, it is preferable that the heat treatment temperature for forming the LOCOS film 16 is on the order of 950° C. or more.

Next, the MOS gate structure of the active region 21 is formed after removing the nitride film 37. Specifically, when, for example, a trench gate type MOS gate structure is formed in the active region 21, firstly, a resist mask (not shown), a portion of which corresponding to a region in which to form the trench 4 is open, is formed on the front surface of the base by photolithography and etching. Next, etching is carried on with the resist mask as a mask, and the trench 4 is formed from the front surface of the base to a depth greater than the thickness of the uppermost n-type epitaxial layer 61. Next, the resist mask used in forming the trench 4 is removed. Next, an insulating film is formed along the surface of the uppermost n-type epitaxial layer 61 and the inner wall of the trench 4, and a polysilicon (poly-Si) layer is deposited on the insulating film so as to be embedded in the trench 4. Further, the polysilicon layer is patterned.

The insulating film formed along the inner wall of the trench 4 is the gate insulating film 5, and the polysilicon layer embedded in the trench 4 is the gate electrode 6. At this time, for example, in the termination structure portion 22, the insulating film formed on the surface of the n-type epitaxial layer 61 forms the second interlayer insulating film 18, and the polysilicon layer deposited on the insulating film forming the second interlayer insulating film 18 forms the field plate electrode 19. Next, a resist mask (not shown), a portion of which corresponding to a region in which to form the p-type base region 7 is open, is formed on the front surface of the base by photolithography and etching. Next, p-type impurity ion implantation is carried out with the resist mask as a mask, and the p-type base region 7 is formed in the surface layer of the uppermost n-type epitaxial layer 61 to a depth the same as the thickness of the uppermost n-type epitaxial layer 61.

Next, after removing the resist mask used in forming the p-type base region 7, the p-type base region 7 is diffused by heat treatment (drive-in) (the second heat treatment step). In this thermal diffusion treatment of the p-type base region 7, the p-type impurity region forming the p-type RESURF region 12c, the p-type impurity regions 68b forming the p-type regions 12b of the second parallel pn layer 15, and the p-type impurity region 68a forming the p-type region 12a immediately below the inner side end portion 17 of the LOCOS film 16 are diffused at the same time as diffusing the p-type base region 7. By so doing, the p-type impurity regions 64, 68a, and 68b vertically opposed in the plurality of stacked n-type epitaxial layers 61 connect together. By so doing, the n-type regions 13 and 14 and p-type regions 11 and 12b of the first and second parallel pn layers 3 and 15 shown in FIG. 2 are formed. The n-type epitaxial layer 61 left in a portion sandwiched between the first and second parallel pn layers 3 and 15 and the n⁺-type semiconductor substrate 1 forms the n-type buffer layer 2.

In this way, heat treatment conditions in each step are set before the thermal diffusion treatment of the p-type base region 7 so that the vertically opposed p-type impurity regions 64 do not connect together. Specifically, an impurity diffusion in the semiconductor portion from the formation of the LOCOS film 16 until before the thermal diffusion treatment of the p-type base region 7 is suppressed by carrying out the heat treatment for forming the LOCOS film 16 at a low temperature and by omitting the thermal diffusion treatment of the p-type RESURF region 12c. Further, the n-type regions 13 and 14 and p-type regions 11 and 12b of the first and second parallel pn layers 3 and 15 are formed by connecting the vertically opposed p-type impurity regions 64, 68*a*, and 68*b* together using the thermal diffusion treatment of the p-type base region 7. By so doing, it is possible to suppress an increase in on-resistance due to an adverse effect of the impurity diffusion in the semiconductor portion.

Next, a resist mask (not shown), a portion of which corresponding to a region in which to form a p$^+$-type contact region (not shown) is open, is formed on the front surface of the base by photolithography and etching. Next, p-type impurity ion implantation is carried out with the resist mask as a mask, thus forming the p$^+$-type contact region in the p-type base region 7. Next, after removing the resist mask used in forming the p$^+$-type contact region, a resist mask (not shown), a portion of which corresponding to a region in which to form the n$^+$-type source region 8 is open, is formed on the front surface of the base. Next, n-type impurity ion implantation is carried out with the resist mask as a mask, thus forming the n$^+$-type source region 8 in the p-type base region 7. Next, after removing the resist mask used in forming the n$^+$-type source region 8, the front surface of the base is covered with the first interlayer insulating film 9.

Next, the insulating film (the insulating film forming the gate insulating film 5 and second interlayer insulating film 18) and first interlayer insulating film 9 on the front surface of the base are patterned by photolithography and etching, thus forming a contact hole to which are exposed the n$^+$-type source region 8 and the p$^+$-type contact region, a contact hole to which is exposed the p-type RESURF region 12*c*, and a contact hole to which is exposed one portion of the field plate electrode 19. Next, a metal electrode is formed on the front surface of the base so as to be embedded in the contact holes. Next, the metal electrode is patterned by photolithography and etching, thus forming the source electrode 10, the stopper electrode 20, and a gate pad (not shown). Subsequently, the epitaxial base is diced (cut) into chips, thereby completing the super junction semiconductor device shown in FIGS. 1A to 1C and 2.

As heretofore described, according to the semiconductor device manufacturing method of the second embodiment, it is possible to obtain the same advantageous effects as in the first embodiment.

Embodiment 3

A description will be given of a semiconductor device manufacturing method according to a third embodiment. FIGS. 11 to 17 are sectional views showing conditions of the semiconductor device in the process of being manufactured according to the third embodiment. FIGS. 11 to 17 show a portion of the termination structure portion 22 shown in FIG. 2 outside the p-type RESURF region 12*c*. The structure of the semiconductor device according to the third embodiment is the same as in the first embodiment (refer to FIGS. 1A to 1C and 2). In the semiconductor device manufacturing method according to the third embodiment, the method of forming the first parallel pn layer 3 is different from in the first embodiment.

Figure 11:
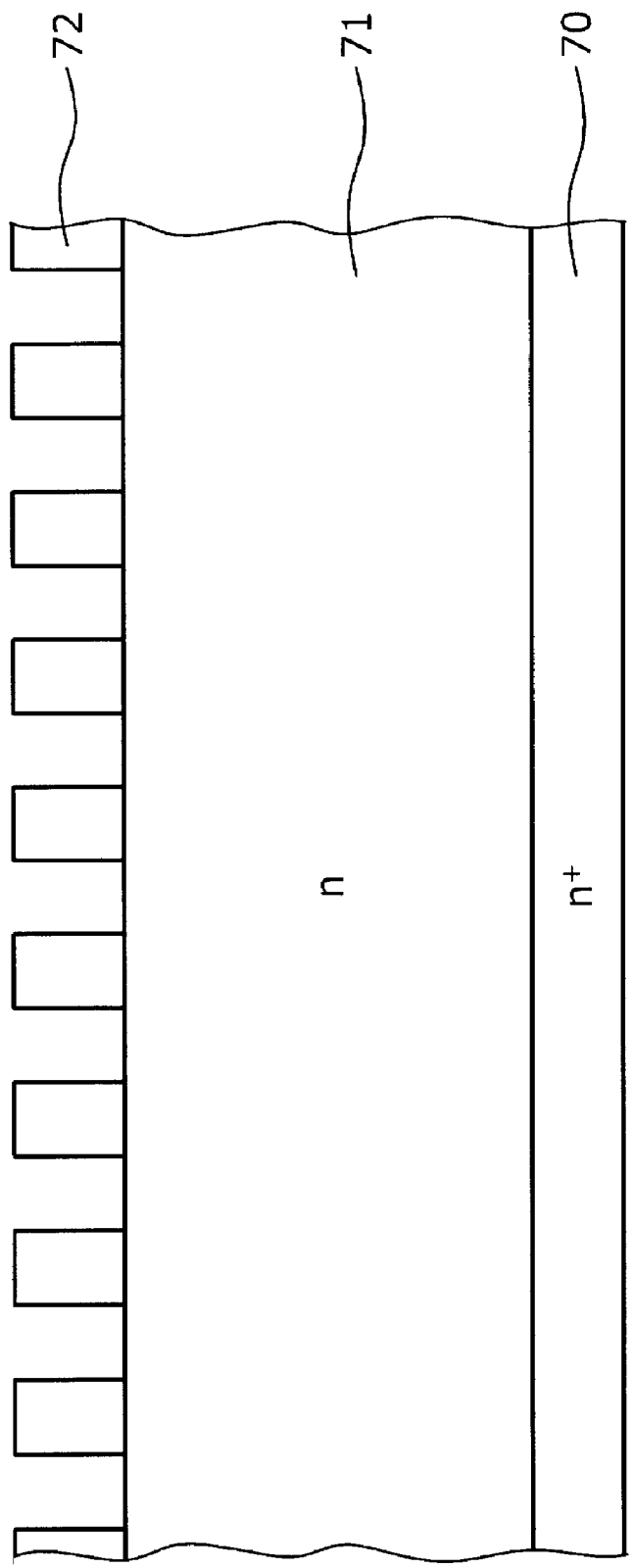
FIG. 11 is a sectional view showing a condition of the semiconductor device in the process of being manufactured according to a third embodiment.

Specifically, firstly, as shown in FIG. 11, an n-type epitaxial layer 71 is deposited to a predetermined thickness (for example, the thickness of the first parallel pn layer 3) on the front surface of an n$^+$-type semiconductor substrate (semiconductor wafer) 70 by an epitaxial growth method. Next, an insulating film 72 is formed on the n-type epitaxial layer 71. The insulating film 72 may be, for example, a thermal oxide film, a monolayer film of an oxide film or nitride film formed by a vapor growth method, or a stacked film of an oxide film and nitride film. Next, patterning of the insulating film 72 is carried out, thus forming opening portions in portions corresponding to regions in which to form the p-type regions 11 of the first parallel pn layer 3.

Figure 12:
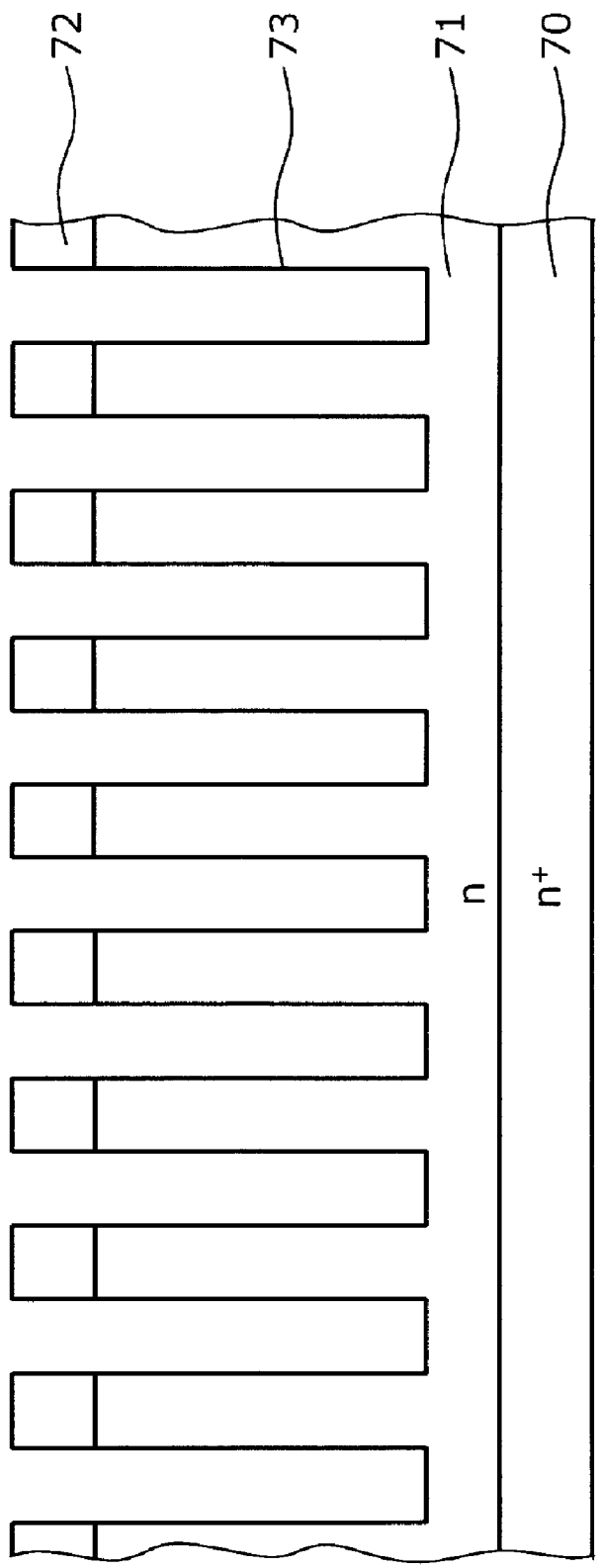
FIG. 12 is a sectional view showing a condition of the semiconductor device in the process of being manufactured according to the third embodiment.

Next, as shown in FIG. 12, etching is carried out with the remaining portion of the insulating film 72 as a mask by, for example, anisotropic dry etching equipment, thus forming trenches 73 in the n-type epitaxial layer 71 to a depth which does not reach the n$^+$-type semiconductor substrate 70. When a damage layer formed due to the etching exists in a portion of the n-type epitaxial layer 71 exposed to the inner walls of the trenches 73, etching and/or sacrificial oxidation which is less likely to do damage to a semiconductor is carried out, thereby removing the damage layer from the inner walls of the trenches 73. As the etching which is less unlikely to do damage to a semiconductor, it is desirable to carry out, for example, wet etching using a method or a chemical whereby an etching substance chemically etches a semiconductor with little or no electric field applied thereto, as in CDE (chemical dry etching), rather than etching wherein an etching substance is physically hit against a semiconductor by electric fields or the like, as in RIE (reactive ion etching).

Figure 13:
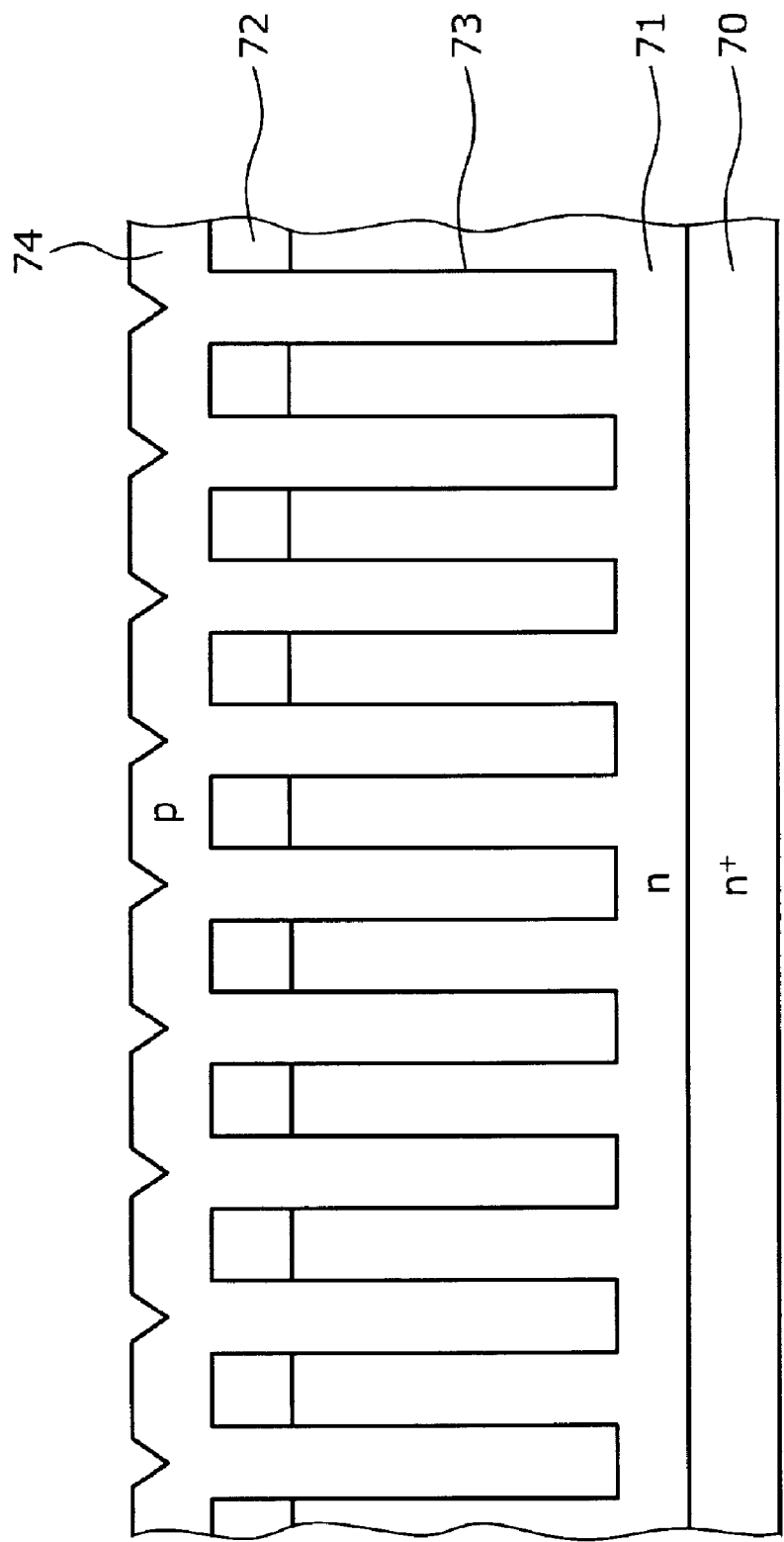
FIG. 13 is a sectional view showing a condition of the semiconductor device in the process of being manufactured according to the third embodiment.
Figure 14:
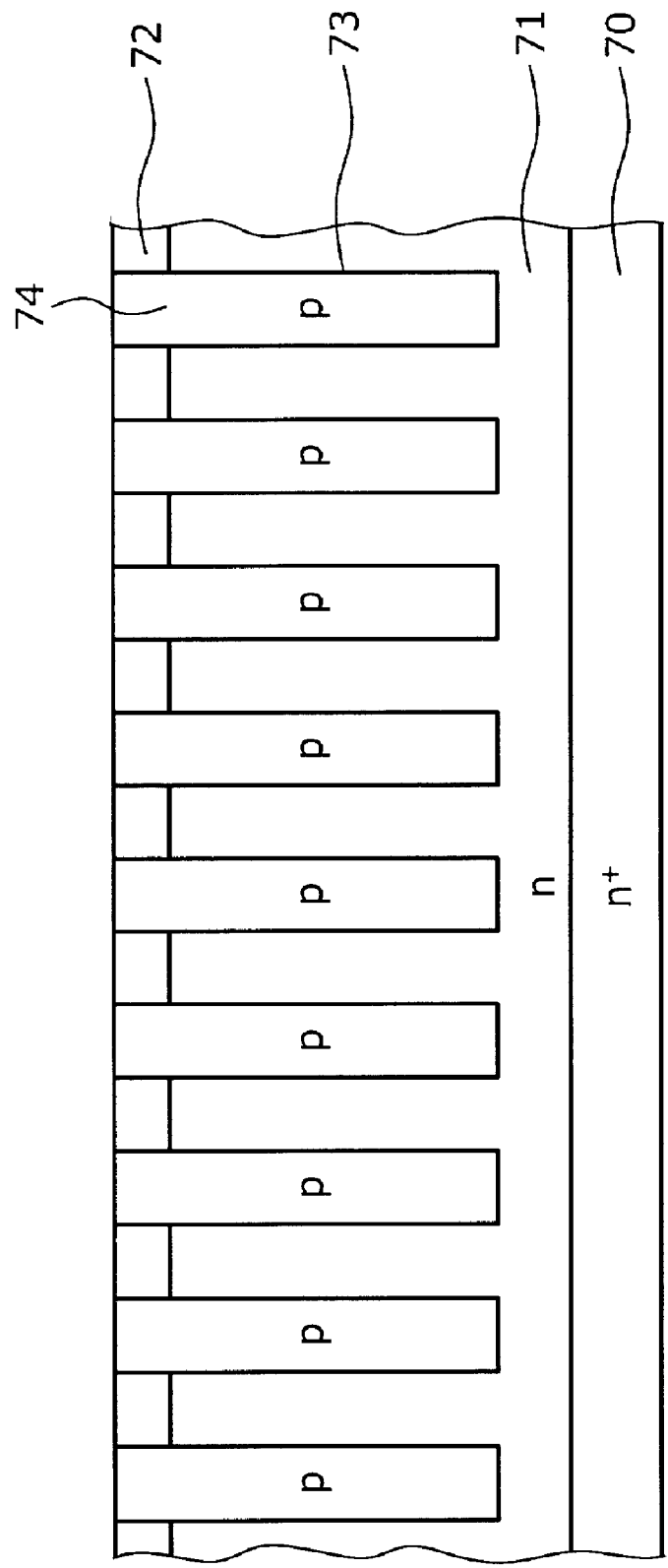
FIG. 14 is a sectional view showing a condition of the semiconductor device in the process of being manufactured according to the third embodiment.

Next, as shown in FIG. 13, a p-type semiconductor layer (p-type epitaxial layer) 74 is epitaxially grown, thus filling the inner portions of the trenches 73. At this time, the p-type semiconductor layer 74 is grown so that the surface of the p-type semiconductor layer 74 is higher in level than at least the surface of the n-type epitaxial layer 71, and it is thereby possible to completely fill the inner portions of the trenches 73 with the p-type semiconductor layer 74. Next, as shown in FIG. 14, the p-type semiconductor layer 74 is polished with the insulating film 72 as a stopper by chemical mechanical polishing (CMP), or the like, thus removing a portion of the p-type semiconductor layer 74 deposited on the insulating film 72.

Figure 15:
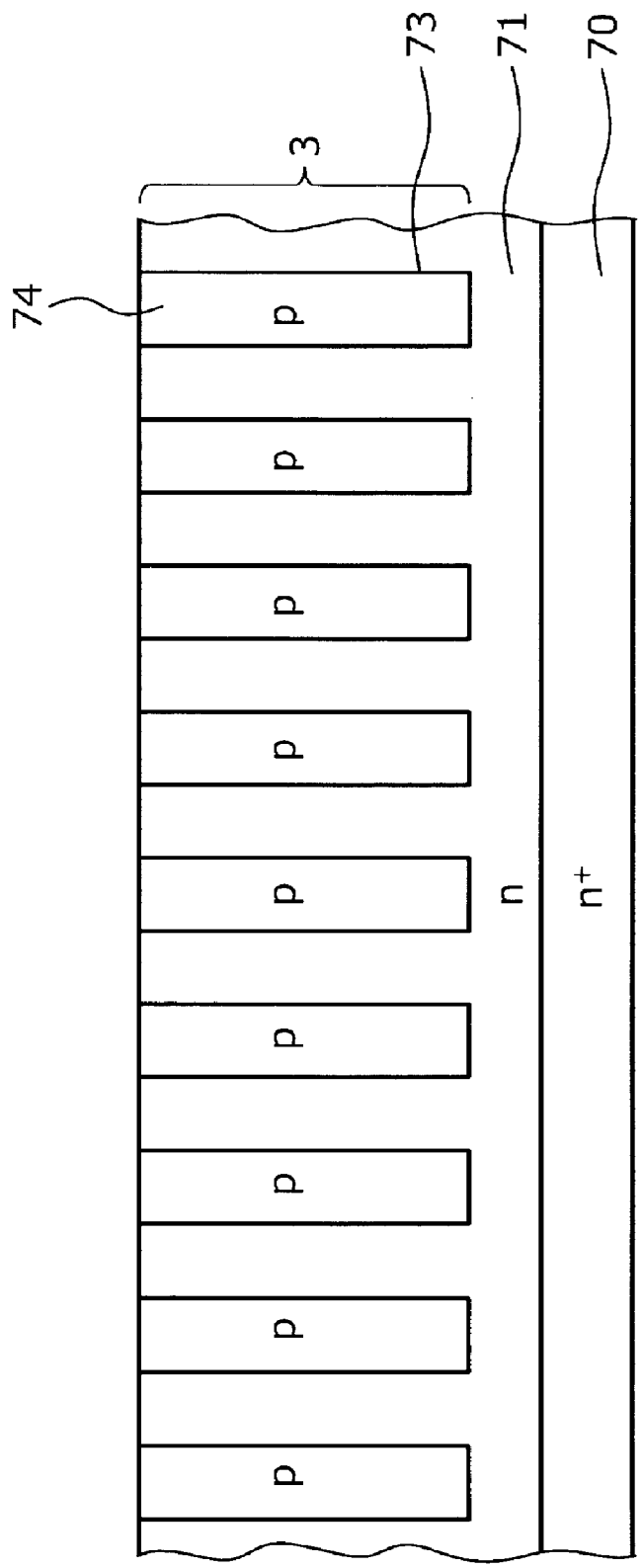
FIG. 15 is a sectional view showing a condition of the semiconductor device in the process of being manufactured according to the third embodiment.

Next, as shown in FIG. 15, as well as the remaining portion of the insulating film 72, an amount of the p-type semiconductor layer 74 equivalent to the same thickness as that of the remaining portion of the insulating film 72 is further polished and thus removed. That is, portions of the p-type semiconductor layer 74 projecting from the surface of the n-type epitaxial layer 71 are removed together with the insulating film 72, thereby making the surface of the n-type epitaxial layer 71 flush with the surface of the p-type semiconductor layer 74. By so doing, the first parallel pn layer 3 wherein the p-type semiconductor layers 74 and portions of the n-type epitaxial layer 71 sandwiched between the trenches 73 are alternately disposed in the lateral direction is formed. The p-type semiconductor layers 74 are portions forming the p-type regions 11 of the first parallel pn layer 3, and the portions of the n-type epitaxial layer 71 sandwiched between the trenches 73 are portions forming the n-type regions 13 of the first parallel pn layer 3.

Also, when forming the first parallel pn layer 3, it is also good that the insulating film 72 is completely removed by, for example, etching in the step of forming the trenches 73 or after the step of forming the trenches 73, and subsequently, the p-type semiconductor layers 74 are epitaxially grown in the inner portions of the trenches 73 (not shown). In this case, the portions of the p-type semiconductor layers 74 projecting from the surface of the n-type epitaxial layer 71 are removed by, for example, one polishing. By so doing, it is possible to form the first parallel pn layer 3 wherein the surface of the n-type epitaxial layer 71 is made flush with the surface of the p-type semiconductor layers 74, in the same way as in the heretofore described case in which the insulating film 72 is used as a stopper.

Figure 16:
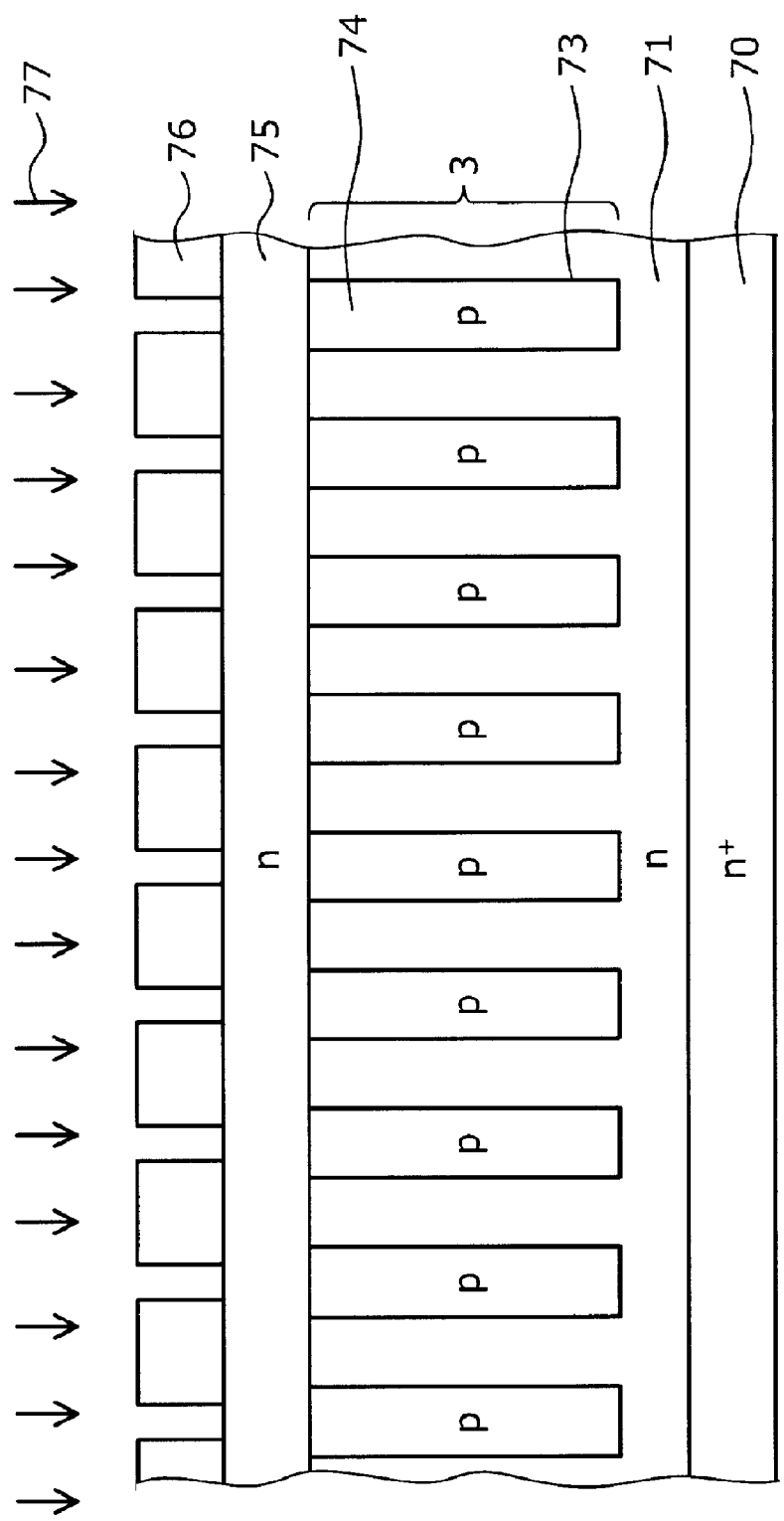
FIG. 16 is a sectional view showing a condition of the semiconductor device in the process of being manufactured according to the third embodiment.

Next, as shown in FIG. 16, a uppermost n-type epitaxial layer 75 is newly deposited on the n-type epitaxial layer 71 (that is, on the first parallel pn layer 3) in the same way as in the first embodiment. Next, a resist mask 76, whose portions corresponding to the regions in which to form the p-type RESURF region 12c and p-type regions 12a and 12b are open, is formed on the front surface of the base (a surface of the epitaxial base on the n-type epitaxial layer 75 side) in the same way as in the first embodiment. At this time, as the LOCOS film 16 is not yet formed on the front surface of the base, no level difference formed by the LOCOS film 16 exists on the surface of the uppermost n-type epitaxial layer 75, in the same way as in the first embodiment. Consequently, it is possible to obtain the same advantageous effects as in the first embodiment.

Figure 17:
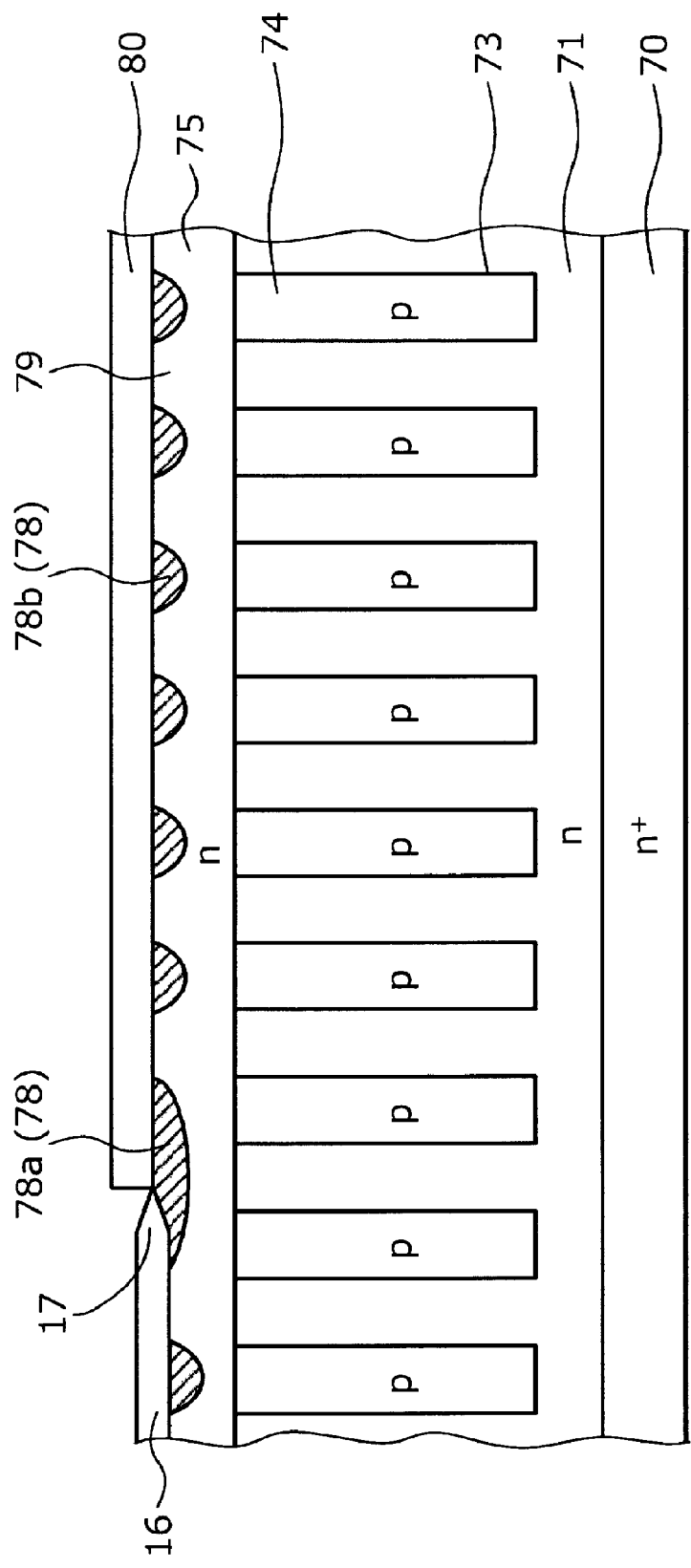
FIG. 17 is a sectional view showing a condition of the semiconductor device in the process of being manufactured according to the third embodiment.

Next, a sixth ion implantation 77 of p-type impurities is performed with the resist mask 76 as a mask. By the sixth ion implantation 77, a p-type impurity region (not shown) forming the p-type RESURF region 12c, p-type impurity regions 78b forming the p-type regions 12b of the second parallel pn layer 15, and a p-type impurity region 78a forming the p-type region 12a immediately below the inner side end portion 17 of the LOCOS film 16 are formed (the uppermost hatched portions) in the surface layer of the uppermost n-type epitaxial layer 75, as shown in FIG. 17, in the same way as in the first embodiment. The sixth ion implantation 77 is, for example, heretofore known ion implantation for forming the p-type RESURF region 12c. Therefore, it is possible to obtain the same advantageous effects as in the first embodiment by forming the p-type impurity regions 78a and 78b using the sixth ion implantation 77. Also, portions (that is, portions (n-type regions) covered with the resist mask 76) 79 into which no impurity is introduced are left, as the n-type regions 14 of the second parallel pn layer 15, in the uppermost n-type epitaxial layer 75, in the same way as in the first embodiment.

Also, when forming p-type impurity regions 78 (the p-type impurity region forming the p-type RESURF region 12c and the p-type impurity regions 78a and 78b) in the inner portion of the uppermost n-type epitaxial layer 75, the p-type impurity regions 78 are disposed in respective positions in the inner portions of the trenches 73 which are vertically opposed to the p-type semiconductor layer 74. By so doing, the vertically opposed p-type impurity regions 78 and p-type semiconductor layers 74 connect together in a diffusion step when forming the MOS gate structure, to be carried out hereafter. Therefore, the p-type impurity regions 78 do not have to be in contact with the p-type semiconductor layers 74 at the point of the sixth ion implantation 77. The dose amount and acceleration energy of the sixth ion implantation 77 are different from one breakdown voltage class to another, but, for example, when born is used as a dopant, the dose amount and the acceleration energy are on the order of $5.0 \times 10^{12}/cm^2$ or more and on the order of 100 keV or more respectively. Sign 80 is a nitride film used as a mask when forming the LOCOS film 16 in the subsequent step. Subsequently, steps subsequent to the step of forming the LOCOS film 16 are carried out in order in the same way as in the first embodiment, thereby completing the super junction semiconductor device shown in FIGS. 1A to 1C and 2.

In the semiconductor device manufacturing method according to the third embodiment, examples of preferred conditions of the dimensions and impurity concentrations of the main portions are as follows. The impurity concentration of the $n^+$-type semiconductor substrate 70 is on the order of $2.0 \times 10^{19}/cm^3$. The impurity concentration of the n-type epitaxial layer 71 is on the order of $5.0 \times 10^{15}/cm^3$ or more, and the thickness thereof is on the order of 2.0 μm or more. The width of the trenches 73 is on the order of about half the pn column pitch of the first parallel pn layer 3 (the repeated pitch of the p-type semiconductor layers 74 and n-type epitaxial layers 71), and the thickness of the trenches 73 is on the order of 2.0 μm or more. The impurity concentration of the p-type semiconductor layers 74 is on the order of $5.0 \times 10^{15}/cm^3$ or more. Both the pn column pitch of the first parallel pn layer 3 and the pn column pitch of the second parallel pn layer 15 (the repeated pitch of the p-type regions 12b and n-type regions 14) are on the order of 2.0 μm. The impurity concentration of the uppermost n-type epitaxial layer 75 in which to form the second parallel pn layer 15 is on the order of $1.0 \times 10^{16}/cm^3$ or more.

As heretofore described, according to the third embodiment, even when forming the first parallel pn layer by embedding the p-type semiconductor layer in the inner portions of the trenches formed in the n-type epitaxial layer, it is possible to obtain the same advantageous effects as in the first embodiment by carrying out the subsequent steps in the same way as in the first embodiment. Furthermore, for example, when stacking a plurality of pn columns forming the p-type regions and n-type regions of the first parallel pn layer by repeatedly carrying out deposition of and ion implantation into an n-type epitaxial layer, there is the possibility of occurrence of variation in the lateral positions and impurity concentrations of the vertically opposed pn columns. Meanwhile, according to the third embodiment, as it is possible to form the first parallel pn layer by embedding the p-type semiconductor layer in the inner portions of the trenches, no variation in the lateral positions and impurity concentrations of the pn columns occurs. Therefore, it is possible to miniaturize the pn column pitch of the first parallel pn layer, and thus possible to reduce on-resistance (low on-voltage).

Embodiment 4

Figure 18A:
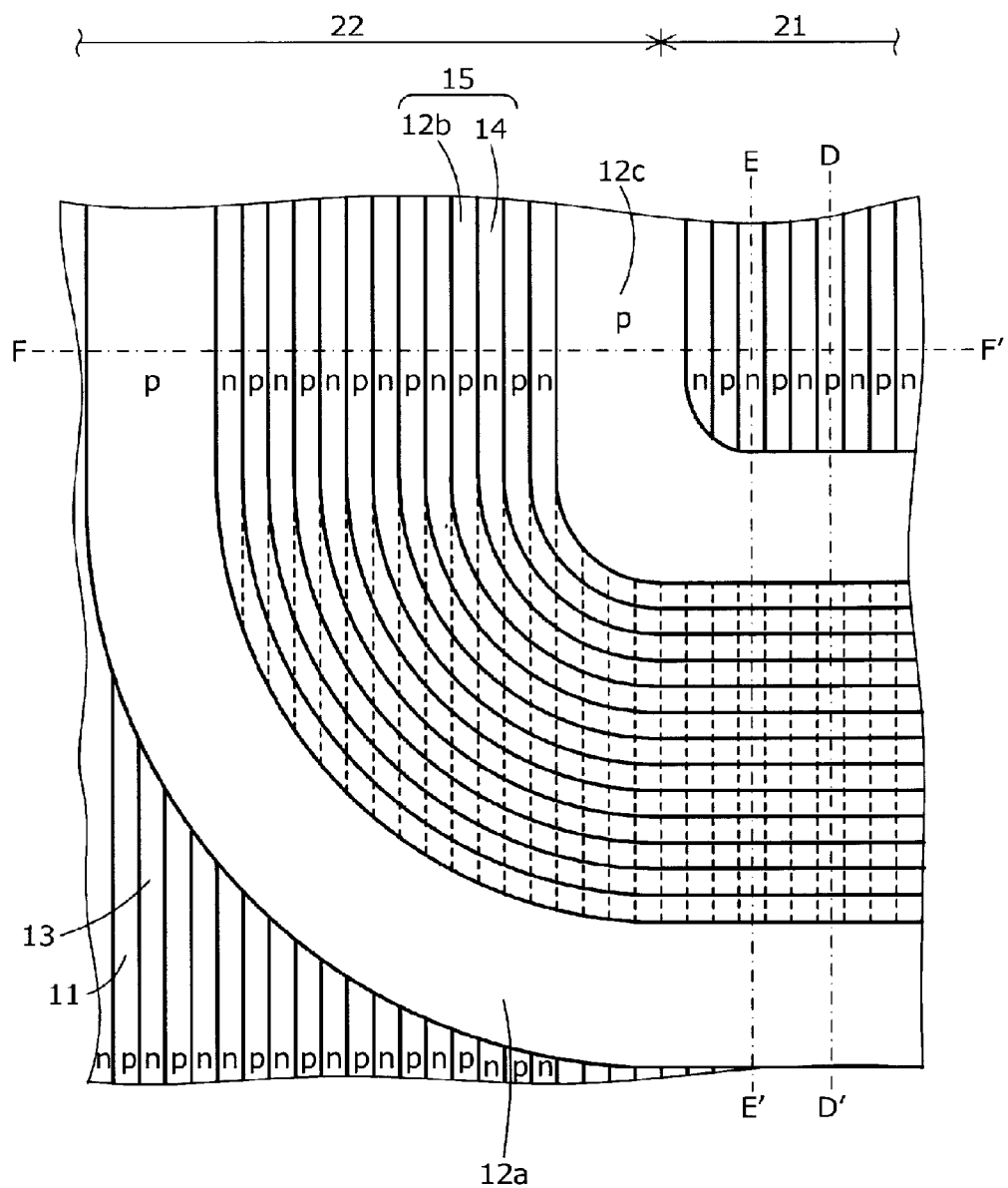
FIG. 18A is a plan view showing a planar structure of a semiconductor device according to a fourth embodiment.
Figure 18B:
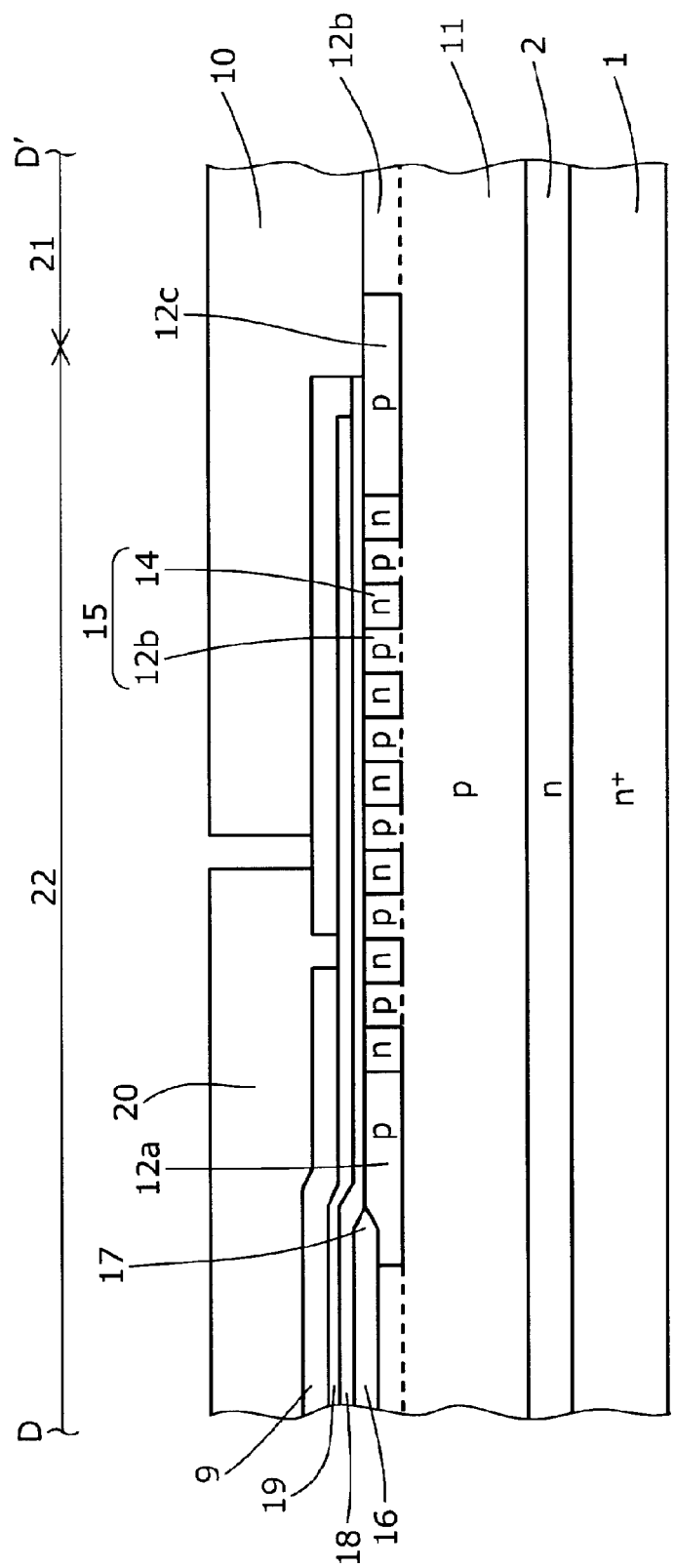
FIG. 18B is a sectional view showing a sectional structure of the semiconductor device according to the fourth embodiment.
Figure 18C:
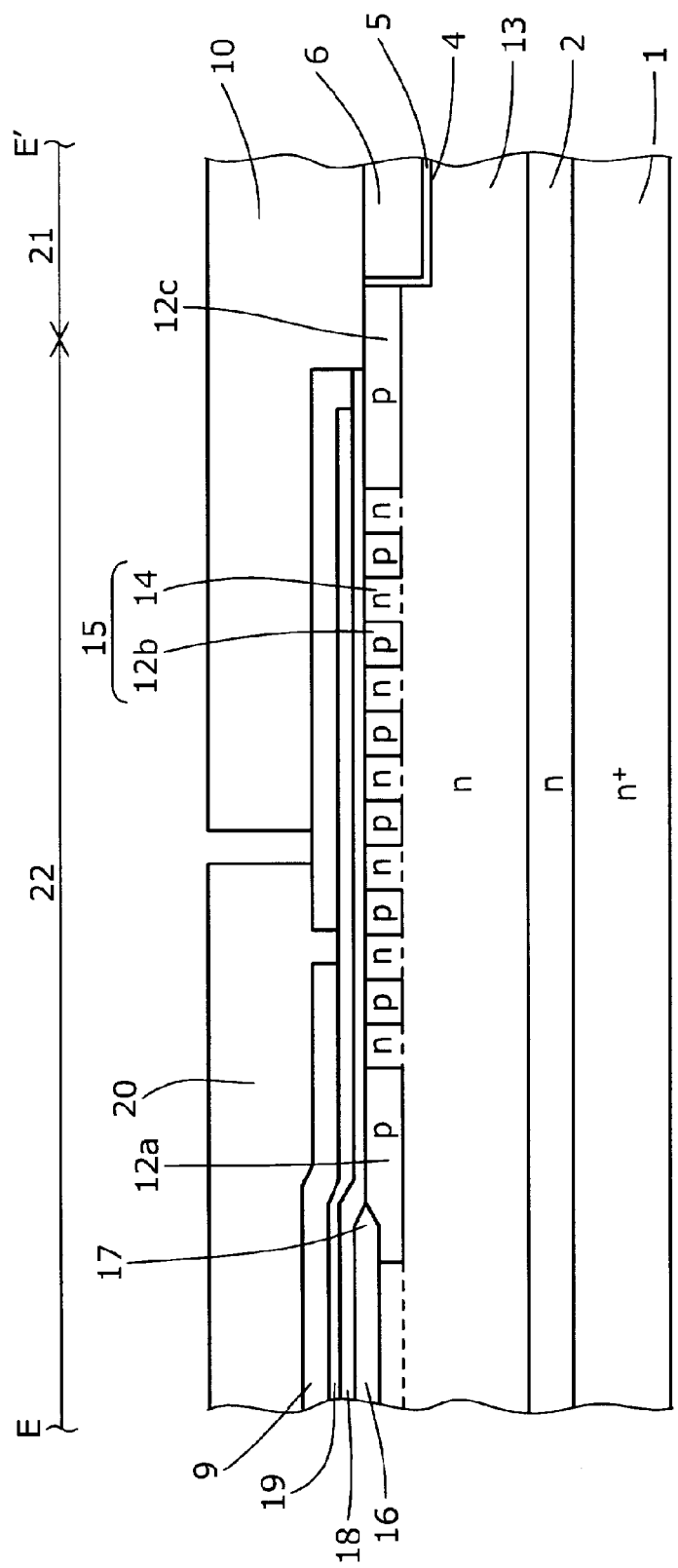
FIG. 18C is a sectional view showing a sectional structure of the semiconductor device according to the fourth embodiment.

A description will be given of a structure of a semiconductor device according to a fourth embodiment. FIG. 18A is a plan view showing a planar structure of the semiconductor device according to the fourth embodiment. FIGS. 18B and 18C are sectional views showing sectional structures of the semiconductor device according to the fourth embodiment. FIG. 18A shows a surface of the semiconductor portion of the terminal structure portion 22 (a surface of the second parallel pn layer 15 configuring the super junction structure) when an epitaxial base (semiconductor chip) wherein a plurality of tiers of epitaxial layers are stacked on the $n^+$-type semiconductor substrate 1 is seen from the front surface side (above). FIG. 18B shows a D-D' sectional view of FIG. 18A, and FIG. 18C shows an E-E' sectional view of FIG. 18A. The sectional structure along the section line F-F' of FIG. 18A is the same as the sectional structure along the section line C-C' in the first embodiment (refer to FIG. 2).

The difference of the semiconductor device according to the fourth embodiment from the semiconductor device according to the first embodiment is in that the p-type regions 12b and n-type regions 14 of the second parallel pn layer 15 are disposed in a concentric (annular) layout in plan view in which the regions 12b and 14 surround the periphery of the p-type RESURF region 12c. By so doing, in adjacent p-type region 12b and n-type region 14, the width of the p-type region 12b can be prevented from being partially larger than the width of the n-type region 14, and the impurity concentration of the p-type region 12b can be prevented from being relatively higher than the impurity concentration of the n-type region 14. Therefore, it is possible to largely charge balance the second parallel pn layer 15. The dashed lines (vertical dashed lines), parallel to the section lines D-D' and E-E', illustrated in the second parallel pn layer 15 in FIG. 18A are boundaries between the n-type regions 13 and p-type regions 11 of the first parallel pn layer 3 immediately below the second parallel pn layers 15.

A semiconductor device manufacturing method according to the fourth embodiment is such that in the semiconductor device manufacturing method according to the first embodiment, the pattern of the openings, of the resist mask used when forming the second parallel pn layer 15, which correspond to the regions in which to form the p-type regions 12b only has to be annular. Also, the semiconductor device according to the fourth embodiment may be fabricated by applying the semiconductor device manufacturing method according to the second or third embodiment or a semiconductor device manufacturing method according to a fifth embodiment to be described hereafter. In this case too, the pattern of the openings, of the resist mask used when forming the second parallel pn layer 15, which correspond to the regions in which to form the p-type regions 12b only has to be annular.

As heretofore described, according to the fourth embodiment, it is possible to obtain the same advantageous effects as in the first embodiment. Also, according to the fourth embodiment, as it is possible to largely charge balance the second parallel pn layer by disposing the second parallel pn layer in an annular layout in plan view, it is possible to prevent a reduction in the breakdown voltage of the terminal structure portion 22 due to a charge imbalance of the second parallel pn layer.

Embodiment 5

A description will be given of the semiconductor device manufacturing method according to the fifth embodiment. FIG. 19 is a sectional view showing a condition of the semiconductor device according to the fifth embodiment in the process of being manufactured. The structure of the semiconductor device according to the fifth embodiment is the same as in the first embodiment (refer to FIGS. 1A to 1C and 2). The difference of the semiconductor device manufacturing method according to the fifth embodiment from the semiconductor device manufacturing method according to the third embodiment is in that when forming the first parallel pn layer 3, trenches 83 are formed in a p-type epitaxial layer 82, and an n-type semiconductor layer (n-type epitaxial layer) 84 is embedded in the inner portions of the trenches 83.

Specifically, firstly, an n-type epitaxial layer 81 and the p-type epitaxial layer 82 are stacked in order with respective optional thicknesses on the n$^+$-type semiconductor substrate 70. The n-type epitaxial layer 81 functions as an n-type buffer layer. Next, an insulating film used as an etching mask for forming the trenches 83 is formed on the p-type epitaxial layer 82 in the same way as in the third embodiment. Patterning of the insulating film is carried out, thus forming openings in portions of the first parallel pn layer 3 corresponding to the regions in which to form the n-type regions 13.

Next, etching is carried out with the remaining portion of the insulating film as a mask by, for example, anisotropic dry etching equipment, thus forming, on the p-type epitaxial layer 82, the trenches 83 which, passing through the p-type epitaxial layer 82 in the depth direction, reach the n-type epitaxial layer 81. When a damage layer formed by the etching exists in a portion of the p-type epitaxial layer 82 exposed to the inner walls of the trenches 83, the damage layer is removed from the inner walls of the trenches 83 by further carrying out etching and/or sacrificial oxidation which is less likely to do damage to the epitaxial layer.

Next, after removing the insulating film 72, the n-type semiconductor layer 84 is epitaxially grown to an optional thickness, thus filling the inner portions of the trenches 83. At this time, the n-type semiconductor layer 84 is epitaxially grown so that the n-type semiconductor layer 84 is deposited to a predetermined thickness on the surface of the p-type epitaxial layer 82. A portion of the n-type semiconductor layer 84 deposited on the surface of the p-type epitaxial layer 82 forms an uppermost n-type epitaxial layer. By so doing, the first parallel pn layer 3 wherein portions of the p-type epitaxial layer 82 sandwiched between the trenches 83 and the n-type semiconductor layers 84 are alternately disposed in the lateral direction, is formed. The portions of the p-type epitaxial layer 82 sandwiched between the trenches 83 are portions forming the p-type regions 11 of the first parallel pn layer 3, and the n-type semiconductor layers 84 are portions forming the n-type regions 13 of the first parallel pn layer 13. The condition so far is shown in FIG. 19.

Next, a wafer (the surface of the n-type semiconductor layer 84) is flattened by polishing using CMP, or the like, a depression on the surface of the n-type semiconductor layer 84 occurring in the vicinity of the center above each trench 83. As the depressions on the surface of the n-type semiconductor layer 84 are small with a depth of 0.2 μm or less and are removed later when forming the trenches configuring the MOS gate structure, there is no problem caused by leaving the depressions as they are. Also, the impurity concentration of the portion of the n-type semiconductor layer 84 deposited on the p-type epitaxial layer 82 (that is, the portion of the n-type semiconductor layer 84 on the first parallel pn layer 3) may be made higher than the impurity concentration of the portions forming the n-type regions 13 of the first parallel pn layer 3. In this case, it is only necessary, after depositing the n-type semiconductor layer 84 (or after flattening the surface of the n-type semiconductor layer 84), to ion implant n-type impurities of, for example, phosphorus from the surface of the n-type semiconductor layer 84, and subsequently, carry out thermal diffusion by an amount equivalent to the thickness of a portion forming an upper layer of the first parallel pn layer 3.

Next, the p-type RESURF region 12c, the p-type regions 12b of the second parallel pn layer 15, and the p-type region 12a immediately below the inner side end portion 17 of the LOCOS film 16 are formed in the surface layer of the portion of the n-type semiconductor layer 84 forming the upper layer of the first parallel pn layer 3. The method of forming the p-type RESURF regions 12c and p-type regions 12a and 12b is the same as in the third embodiment. Subsequently, the steps subsequent to the step of forming the LOCOS film 16 are carried out in order in the same way as in the third embodiment, thereby completing the super junction semiconductor device shown in FIGS. 1A to 1C and 2.

In the fifth embodiment, it is possible to form the portions forming the n-type regions 13 of the first parallel pn layer 3 and the portion forming the uppermost n-type epitaxial layer at the same time by embedding the n-type semiconductor layer 84 in the inner portions of the trenches 83 formed in the p-type epitaxial layer 82. Also, no surface polishing is necessary either after embedding the n-type semiconductor layer 84 in the inner portions of the trenches 83. Therefore, it is possible to simplify steps, and thus possible to achieve a reduction in cost owing to the reduction of steps.

In the semiconductor device manufacturing method according to the fifth embodiment, examples of preferred conditions of the dimensions and impurity concentrations of the main portions are as follows. The impurity concentration of the n+-type semiconductor substrate 70 is on the order of $2.0 \times 10^{19}/cm^3$. The impurity concentration of the n-type epitaxial layer 81 is on the order of $1.0 \times 10^{16}/cm^3$ or more, and the thickness thereof is on the order of 2.0 μm. The width of the trenches 83 is on the order of about half the pn column pitch of the first parallel pn layer 3 (the repeated pitch of the p-type semiconductor layers 82 and n-type epitaxial layers 84), and the thickness of the trenches 83 is on the order of 2.0 μm or more. The impurity concentration of the p-type epitaxial layer 82 is on the order of $5.0 \times 10^{15}/cm^3$ or more, and the thickness thereof is on the order of 2.0 μm or more. The pn column pitch of the first parallel pn layer 3 is on the order of 2.0 μm. The impurity concentration of the n-type semiconductor layer 84 is on the order of $5.0 \times 10^{15}/cm^3$.

As heretofore described, according to the fifth embodiment, it is possible to obtain the same advantageous effects as in the third embodiment. Also, according to the fifth embodiment, as it is possible to simplify steps by forming the first parallel pn layer by embedding the n-type semiconductor layer in the inner portions of the trenches formed in the p-type epitaxial layer, it is possible to achieve a reduction in cost.

WORKING EXAMPLE 1

Figure 20:
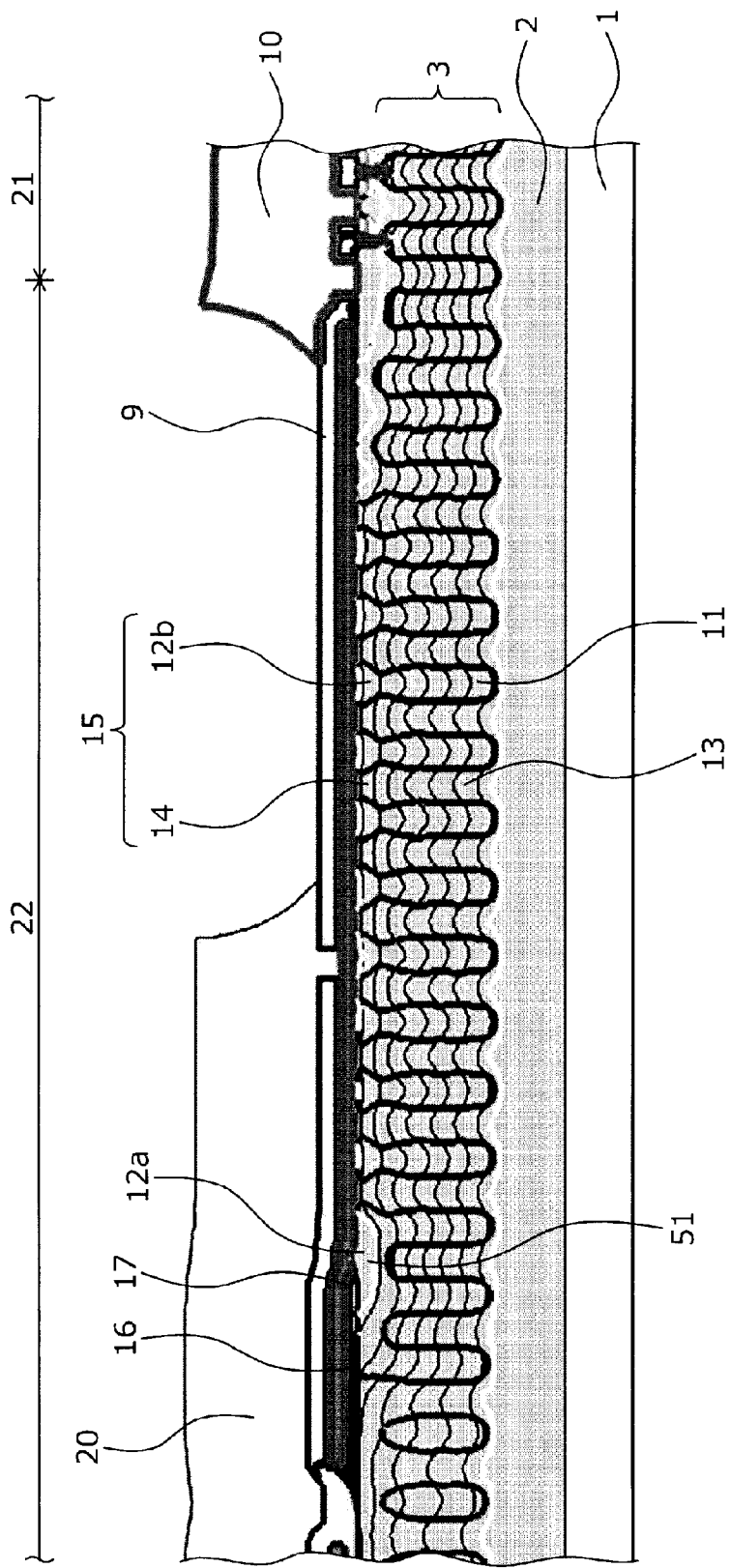
FIG. 20 is an illustration showing equipotential lines of the semiconductor device according to the first embodiment.
Figure 21:
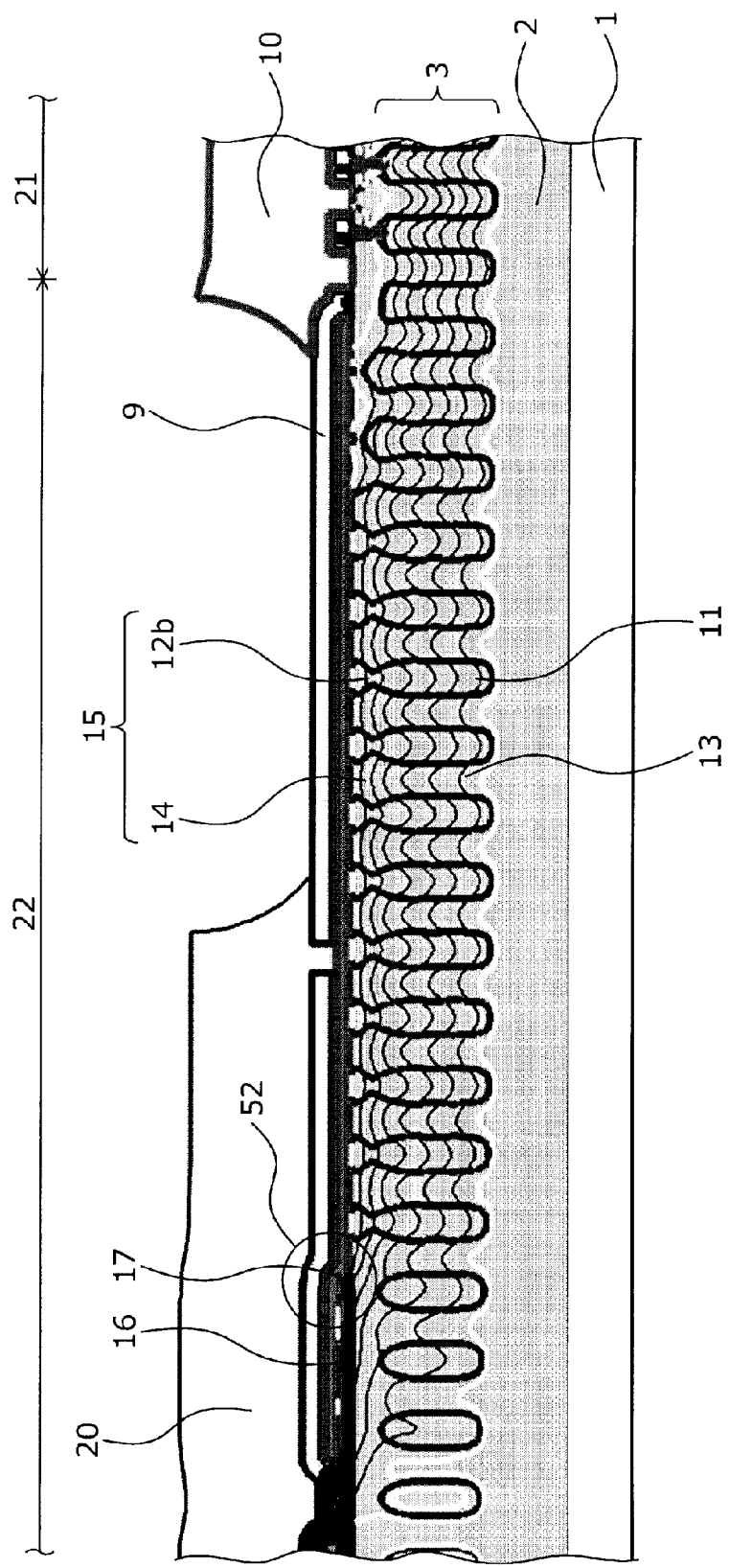
FIG. 21 is an illustration showing equipotential lines of a semiconductor device of a comparison example.
Figure 22:
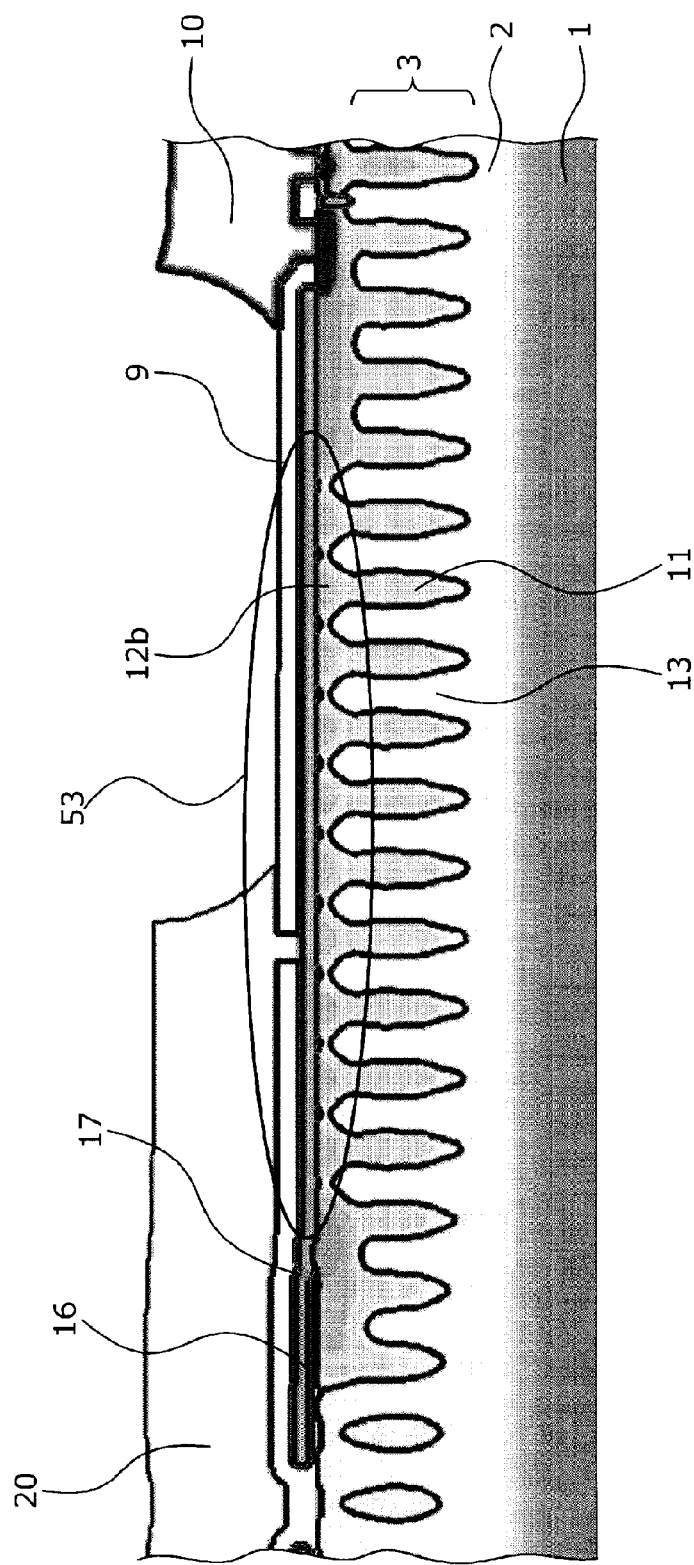
FIG. 22 is a sectional view schematically showing a structure of the semiconductor device of the comparison example.

Next, verification is given of the breakdown voltage of the semiconductor device according to the embodiment. FIG. 20 is an illustration showing equipotential lines of a semiconductor device according to a first working example. FIG. 21 is an illustration showing equipotential lines of a semiconductor device of a comparison example. FIG. 22 is a sectional view schematically showing a structure of the semiconductor device of the comparison example. Firstly, a super junction semiconductor device is fabricated (manufactured) in accordance with the semiconductor device manufacturing methods according to the heretofore described embodiments (hereafter referred to as the first working example). A super junction semiconductor device wherein the p-type impurity ion implantation for forming the p-type regions 12a and 12b in the termination structure portion 22 is carried out after forming the LOCOS film 16 at a heat treatment temperature (an oxidation temperature: 1100° C.) higher than in the first working example (hereafter referred to as the comparison example) is prepared as a comparison. Configurations of the comparison example other than the timing of forming the LOCOS film 16 and the oxidation conditions of the LOCOS film 16 are the same as those of the first working example. Results from simulating the equipotential lines of the first working example and comparison example are respectively shown in FIGS. 20 and 21. A result from simulating a sectional structure of the comparison example is shown in FIG. 22.

As shown in FIG. 20, it is confirmed in the first working example that by providing the p-type region 12a immediately below the inner side end portion 17 of the LOCOS film 16, the intervals of equipotential lines (the black solid lines) in a portion 51 of the semiconductor portion immediately below the inner side end portion 17 of the LOCOS film 16 are wider, and the electric field is more relaxed, than when the p-type region 12a is not provided. That is, there exists no breakdown generation portion occurring when as thin an n-type region as the p-type region 12a is disposed in the portion 51 immediately below the inner side end portion 17 of the LOCOS film 16. Also, a depletion layer (the white solid line) expands to the vicinity of the interface between the LOCOS film 16 and the semiconductor portion in the portion 51 immediately below the inner side end portion 17 of the LOCOS film 16. Therefore, it is possible to increase the breakdown voltage of the termination structure portion 22 in response to the extent of the expansion of the depletion layer in the vicinity of the interface between the LOCOS film 16 and the semiconductor portion.

Meanwhile, as shown in FIG. 21, it is confirmed in the comparison example that no p-type region 12a is formed below the level difference formed on the surface of the semiconductor portion by the inner side end portion 17 of the LOCOS film 16 (the p-type region 12a does not cover the level difference). Therefore, it is confirmed that the portion immediately below the inner side end portion 17 of the LOCOS film 16 forms a breakdown generation portion 52 and the breakdown voltage of the termination structure portion 22 is lower than the breakdown voltage of the active region 21. Also, in the comparison example, as the p-type impurity ion implantation for forming the p-type regions 12a and 12b is carried out after forming the LOCOS film 16, the diffusion of the p-type regions 12a and 12b is suppressed, and it appears that the second parallel pn layer 15 is formed as in the first embodiment. As shown in FIG. 22, however, it is confirmed that the p-type regions 12b of the second parallel pn layer 15 connect together in the lateral direction, and the n-type regions 14 of the second parallel pn layer 15 disappear, due to the allowable limit of the patterning accuracy of an ion implantation mask (the portion indicated by reference numeral 53). Consequently, it is preferable that the oxidation temperature of the LOCOS film 16 is low.

WORKING EXAMPLE 2

Figure 23:
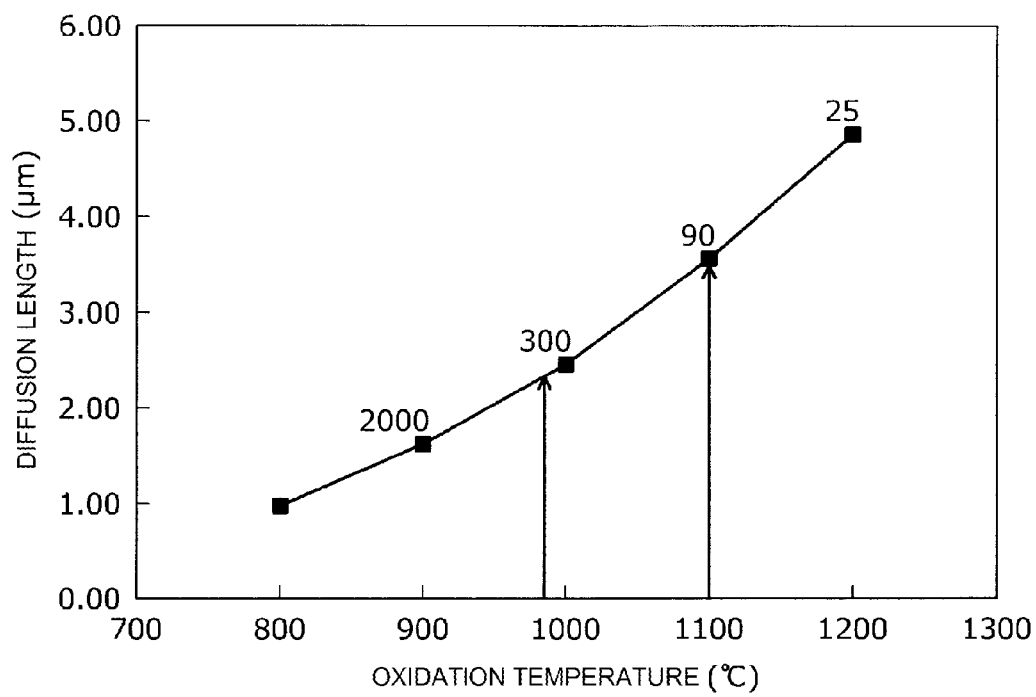
FIG. 23 is a characteristic diagram showing a relationship between an oxidation temperature and the diffusion length of p-type regions.
Figure 24:
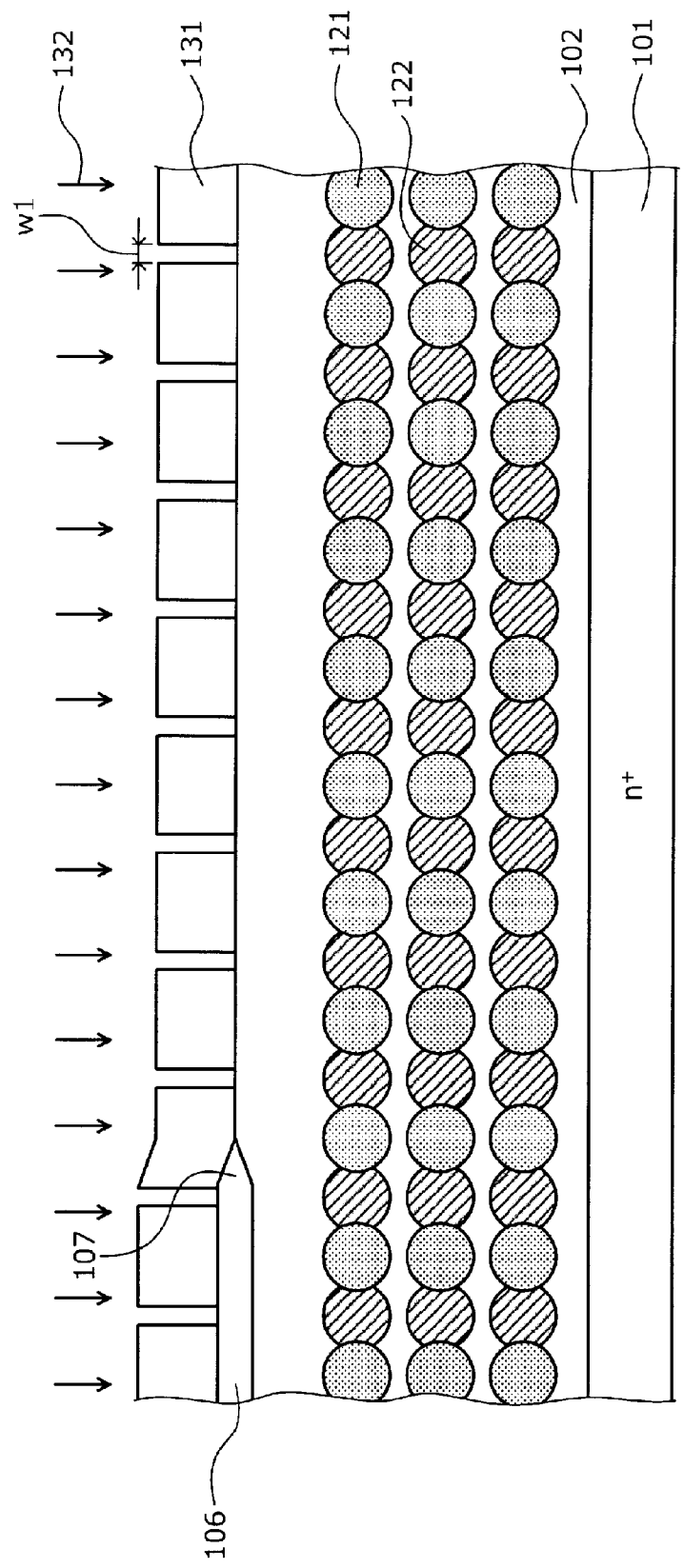
FIG. 24 is a sectional view showing a condition of a heretofore known super junction semiconductor device in the process of being manufactured.
Figure 25:
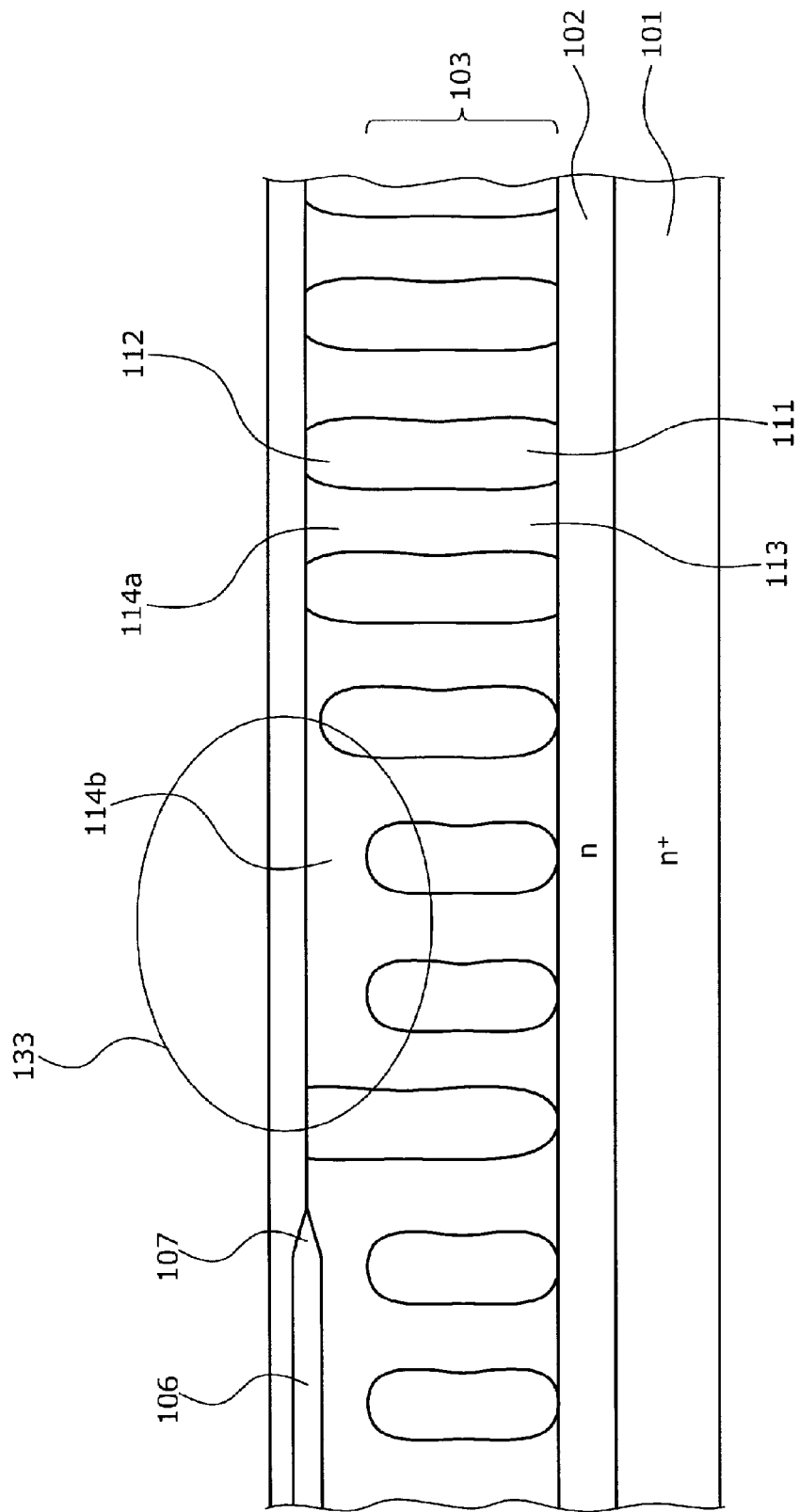
FIG. 25 is a sectional view schematically showing a condition in which a defect occurs in the process of manufacturing the heretofore known super junction semiconductor device.

Next, verification is given of the relationship between the oxidation temperature of the LOCOS film 16 and the diffusion length (width) of the p-type regions 12b of the second parallel pn layer 15. FIG. 23 is a characteristic diagram showing the relationship between the oxidation temperature and the diffusion length of the p-type regions. A plurality of super junction semiconductor devices different in the oxidation temperature of the LOCOS film 16 are fabricated in accordance with the semiconductor device manufacturing methods according to the heretofore described embodiments (hereafter referred to as second working examples). The thickness of the LOCOS film 16 is set to 8000 Å in each second working example. FIG. 23 shows results from measuring the oxidation time (heat treatment time) of the LOCOS film 16 and the diffusion length of the p-type regions 12b of the second parallel pn layer 15 in the second working examples. FIG. 23 shows the oxidation time of the LOCOS film 16 on the horizontal axis and the diffusion length of the p-type regions 12b of the second parallel pn layer 15 on the vertical axis. Also, the oxidation time of the LOCOS film 16 at each oxidation temperature is shown in the vicinity of each plot (the black squares).

It is confirmed from the results shown in FIG. 23 that it is possible to reduce the diffusion length of the p-type regions 12b of the second parallel pn layer 15 by 1 μm or more by suppressing the oxidation temperature of the LOCOS film 16 to 1000° C. or less, compared with when the oxidation temperature of the LOCOS film 16 is set to 1100° C. (the heretofore described comparison example). When the oxidation temperature of the LOCOS film 16 is lowered, the oxidation time required to form the LOCOS film 16 to a predetermined thickness increases at an accelerated rate. It is no practicable to form the 8000 Å thick LOCOS film 16 at, for example, a temperature of 900° C. because the pyrogenic oxidation time required for the formation exceeds 24 hours (one day). Consequently, when the width (the repetitive pitch of the n-type regions and p-type regions) of the n-type regions 13 and 14 and p-type regions 11 and 12b of the first and second parallel pn layers 3 and 15 is 2 μm or more and 3 μm or less, it is preferable in terms of cost that the oxidation temperature of the LOCOS film 16 is on the order of 980° C.

In the invention, a description has heretofore been given with a vertical MOSFET as an example, but the invention can be applied not only to the heretofore described embodiments, but to super junction semiconductor devices of various configurations wherein the parallel pn layers are provided from the active region over to the termination structure portion. Also, in each embodiment, the first conductivity type is an n-type, and the second conductivity type is a p-type, but the invention also holds true in the same way when the first conductivity type is a p-type and the second conductivity type is an n-type. Furthermore, in each embodiment, the planar layout is in a striped pattern, but the invention also holds true in the same way when the planar layout is in a reticular pattern.

As in the above, the semiconductor device manufacturing method according to the invention is useful for a power semiconductor device used in an environmentally friendly automobile, a consumer electrical appliance, or the like.

While the present invention has been described in conjunction with embodiments and variations thereof, one of ordinary skill, after reviewing the foregoing specification, will be able to effect various changes, substitutions of equivalents and other alterations without departing from the broad concepts disclosed herein. It is therefore intended that Letters Patent granted hereon be limited only by the definition contained in the appended claims and equivalents thereof.

What is claimed is:

1. A method of manufacturing a semiconductor device including:
    an active region through which a current flows when in an on-state;
    a termination structure portion surrounding the active region, which secures a predetermined breakdown voltage;
    a first parallel pn layer provided from the active region over to the termination structure portion, in which first-conductivity-type semiconductor regions and second-conductivity-type semiconductor regions are alternately disposed; and
    a second parallel pn layer disposed on the top of the first parallel pn layer, the method comprising:
    (a) forming the first parallel pn layer in a first formation step;
    (b) depositing a first-conductivity-type first semiconductor layer on a surface of the first parallel pn layer in a second formation step that further includes forming the second parallel pn layer by selectively introducing second-conductivity-type impurities into the first semiconductor layer; and forming first second-conductivity-type impurity regions in positions opposed in a depth direction to regions of the first parallel pn layer in which the second-conductivity-type semiconductor regions are formed;
    (c) forming a local insulating film on a surface of the first semiconductor layer in the termination structure portion so that an end portion of the local insulating film is positioned on the first second-conductivity-type impurity region, by heating in a first heat treatment at a low temperature effective to suppress diffusion of the first second-conductivity-type impurity regions; and
    (d) diffusing the first second conductivity type impurity regions by heating in a second heat treatment.

2. The semiconductor device manufacturing method according to claim 1, wherein the first formation step further comprises providing a stacked plurality of the second semiconductor layers having a total thickness that reaches a predetermined thickness by repeatedly (i) depositing a second semiconductor layer; (ii) selectively introducing first-conductivity-type impurities and second-conductivity-type impurities into the second semiconductor layer; and (iii) alternately disposing first-conductivity-type impurity regions and second second-conductivity-type impurity regions in the surface layer of the second semiconductor layer.

3. The semiconductor device manufacturing method according to claim 2, wherein, in the first heat treatment step, a condition is maintained in which the first-conductivity type-impurity regions opposed in the depth direction are spaced from one another and the second second-conductivity-type impurity regions opposed in the depth direction are spaced from one another.

4. The semiconductor device manufacturing method according to claim 2, wherein, in the first formation step, the first-conductivity-type impurities and the second-conductivity-type impurities are selectively introduced into the second semiconductor layer by ion implantation in respective dose amounts and acceleration energies selected so that the first-conductivity-type impurity regions and second second-conductivity-type impurity regions formed in the newly stacked second semiconductor layer are spaced from the respective first-conductivity-type impurity regions and second second-conductivity-type impurity regions opposed thereto in the depth direction.

5. The semiconductor device manufacturing method according to claim 4, wherein, in the second heat treatment step, the first-conductivity-type semiconductor region is formed so that the first-conductivity-type impurity regions opposed in the depth direction are connected together, and the second-conductivity-type semiconductor region is formed so that the second second-conductivity-type impurity regions and first second-conductivity-type impurity region opposed in the depth direction are connected together.

6. The semiconductor device manufacturing method according to claim 5, wherein the first-conductivity-type semiconductor regions have a repetitive pitch with the second-conductivity-type semiconductor region there between of 3.0 μm or less.

7. The semiconductor device manufacturing method according to claim 2, wherein, in the second heat treatment step, the first-conductivity-type semiconductor region is formed so that the first-conductivity-type impurity regions opposed in the depth direction are connected together, and the second-conductivity-type semiconductor region is formed so that the second second-conductivity-type impurity regions and first second-conductivity-type impurity region opposed in the depth direction are connected together.

8. The semiconductor device manufacturing method according to claim 7, wherein the first-conductivity-type semiconductor regions have a repetitive pitch with the second-conductivity-type semiconductor region there between of 3.0 μm or less.

9. The semiconductor device manufacturing method according to claim 1, wherein the first formation step further comprises providing a stacked plurality of the second semiconductor layers having a total thickness that reaches a predetermined thickness by repeatedly (i) depositing a first-conductivity-type second semiconductor layer; (ii) selectively introducing second-conductivity-type impurities into the second semiconductor layer; and (iii) disposing a plurality of second second-conductivity-type impurity regions spaced from one another in a direction perpendicular to the depth direction on the surface layer of the second semiconductor layer.

10. The semiconductor device manufacturing method according to claim 9, wherein, in the first heat treatment step, a condition is maintained in which the second second-conductivity-type impurity regions opposed in the depth direction are spaced from one another.

11. The semiconductor device manufacturing method according to claim 10, wherein, in the second heat treatment step, the second-conductivity-type semiconductor region is formed so that the second second-conductivity-type impurity regions and first second-conductivity-type impurity region opposed in the depth direction are connected together.

12. The semiconductor device manufacturing method according to claim 11, wherein adjacent second-conductivity-type semiconductor regions have a repetitive pitch of 3.0 μm or less.

13. The semiconductor device manufacturing method according to claim 9, wherein, in the first formation step, the second-conductivity-type impurities are selectively introduced into the second semiconductor layer by ion implantation in a dose amount and acceleration energy selected so that the second second-conductivity-type impurity regions formed in the newly stacked second semiconductor layer are spaced from the respective second second-conductivity-type impurity regions opposed thereto in the depth direction.

14. The semiconductor device manufacturing method according to claim 13, wherein, in the second heat treatment step, the second-conductivity-type semiconductor region is formed so that the second second-conductivity-type impurity regions and first second-conductivity-type impurity region opposed in the depth direction are connected together.

15. The semiconductor device manufacturing method according to claim 14, wherein adjacent second-conductivity-type semiconductor regions have a repetitive pitch of 3.0 μm or less.

16. The semiconductor device manufacturing method according to claim 1, wherein the first heat treatment step is carried outat a temperature of 1000° C. or less for 350 minutes or less.

17. The semiconductor device manufacturing method according to claim 1, further comprising, after the first heat treatment step, forming, in an element structure formation step that includes a diffusion step, an insulated gate structure comprised of a metal oxide semiconductor in the first semiconductor layer in the active region,
wherein the second heat treatment step is carried out at the same time as the diffusion step of the element structure formation step, which diffuses a semiconductor region in which a channel is formed.

18. The semiconductor device manufacturing method according to claim 1, wherein the second parallel pn layer is formed in the termination structure portion.

19. The semiconductor device manufacturing method according to claim 1, wherein the first formation step further comprises depositing a first-conductivity-type third semiconductor layer; forming trenches of a predetermined depth in the third semiconductor layer; embedding a second-conductivity-type fourth semiconductor layer in the trenches; and flattening a surface of the fourth semiconductor layer and exposing a surface of the third semiconductor layer.

20. The semiconductor device manufacturing method according to claim 19, wherein the first heat treatment is carried out at a temperature of 1000° C. or less for 350 minutes or less.

21. The semiconductor device manufacturing method according to claim 20, wherein, in the second heat treatment step, the second-conductivity-type semiconductor region is formed so that the first second-conductivity-type impurity region and fourth semiconductor layer opposed in the depth direction are connected together.

22. The semiconductor device manufacturing method according to claim 19, wherein, in the second heat treatment step, the second-conductivity-type semiconductor region is formed so that the first second-conductivity-type impurity region and fourth semiconductor layer opposed in the depth direction are connected together.

23. The semiconductor device manufacturing method according to claim 1, wherein, in the second formation step, the first second-conductivity-type impurity region is annularly formed.

24. A method of manufacturing a semiconductor device including:
an active region through which a current flows when in an on-state;
a termination structure portion surrounding the active region, which secures a predetermined breakdown voltage;
a first parallel pn layer provided from the active region over to the termination structure portion, in which first-conductivity-type semiconductor regions and second-conductivity-type semiconductor regions are alternately disposed; and
a second parallel pn layer disposed on the top of the first parallel pn layer, the method comprising:
(a) forming the first parallel pn layer in a first formation step;
(b) depositing a first-conductivity-type first semiconductor layer on a surface of the first parallel pn layer in a second formation step that further includes forming the second parallel pn layer by selectively introducing second-conductivity-type impurities into the first semiconductor layer; and forming first second-conductivity-type impurity regions in positions opposed in a depth direction to regions of the first parallel pn layer in which the second-conductivity-type semiconductor regions are formed; and
(c) forming a local insulating film on a surface of the first semiconductor layer in the termination structure portion so that an end portion of the local insulating film is positioned on the first second-conductivity-type impurity region, by heating in a first heat treatment at a low temperature effective to suppress diffusion of the first second-conductivity-type impurity regions.

* * * * *